(12) United States Patent
Watanabe et al.

(10) Patent No.: US 11,799,475 B2
(45) Date of Patent: Oct. 24, 2023

(54) SEMICONDUCTOR DEVICE AND METHOD FOR CONTROLLING BODY BIAS THEREOF

(71) Applicant: Renesas Electronics Corporation, Tokyo (JP)

(72) Inventors: Hiroyuki Watanabe, Tokyo (JP); Hideshi Shimo, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 17/940,348

(22) Filed: Sep. 8, 2022

(65) Prior Publication Data
US 2023/0081996 A1   Mar. 16, 2023

(30) Foreign Application Priority Data
Sep. 10, 2021  (JP) .................................. 2021-147907

(51) Int. Cl.
| | | |
|---|---|---|
| G11C 5/14 | (2006.01) | |
| H03K 17/687 | (2006.01) | |
| H03K 3/03 | (2006.01) | |
| G11C 11/4074 | (2006.01) | |
| H01L 27/092 | (2006.01) | |
| H03K 19/20 | (2006.01) | |
| G05F 3/20 | (2006.01) | |

(52) U.S. Cl.
CPC ......... *H03K 17/6871* (2013.01); *G11C 5/146* (2013.01); *G11C 11/4074* (2013.01); *H03K 3/0315* (2013.01); *G05F 3/205* (2013.01); *H01L 27/092* (2013.01); *H03K 19/20* (2013.01)

(58) Field of Classification Search
CPC .... G05F 3/205; H03K 3/0315; H03K 17/687; H03K 17/6871; H03K 17/6872; H03K 19/20; G11C 5/14; G11C 5/145; G11C 5/146; G11C 5/147; G11C 11/4074; H01L 27/092
See application file for complete search history.

(56) References Cited

U.S. PATENT DOCUMENTS 6,466,077 B1 * 10/2002 Miyazaki ................ G05F 3/205
                                                        327/534
6,853,177 B2    2/2005 Shibayama et al.
(Continued)

FOREIGN PATENT DOCUMENTS

JP        2002359289 A    12/2002

*Primary Examiner* — Long Nguyen
(74) *Attorney, Agent, or Firm* — SCULLY, SCOTT, MURPHY & PRESSER, P.C.

(57) ABSTRACT

A semiconductor device and a method for controlling body bias thereof capable of properly controlling body bias of a transistor even in a case where process variation occurs are provided. Operation speeds of ring oscillators ROSCn and ROSCp respectively change due to an influence of process variation at an NMOS transistor MN side and a PMOS transistor MP side. Speed/bias data represent a correspondence relationship between the operation speeds of the ring oscillators ROSCn and ROSCp and set values V1n and V1p of body biases VBN and VBP. A body bias controller receives speed values Sn and Sp measured for the ring oscillators ROSCn and ROSCp to which the body biases VBN and VBP based on default values are respectively applied, and obtains the set values V1n and V1p on the basis of the speed/bias data.

12 Claims, 16 Drawing Sheets

(56) References Cited

U.S. PATENT DOCUMENTS 9,201,440 B2 * 12/2015 Makiyama ........... H03K 17/687
2016/0043717 A1 * 2/2016 Makiyama ........... H03K 17/687
327/537

* cited by examiner

SEMICONDUCTOR DEVICE AND METHOD FOR CONTROLLING BODY BIAS THEREOF

CROSS-REFERENCE TO RELATED APPLICATIONS

The disclosure of Japanese Patent Application No. 2021-147907 filed on Sep. 10, 2021 including the specification, drawings and abstract is incorporated herein by reference in its entirety.

BACKGROUND

The present invention relates to a semiconductor device and a method for controlling body bias thereof.

Patent Document 1 discloses a semiconductor device including a process monitor circuit and a timing adjusting circuit. The process monitor circuit includes a ring oscillator composed of a plurality of stages of inverters, and compares oscillation frequency of the ring oscillator with a reference value. Each inverter is formed by an element that has the same device structure as that of a MOS transistor included in various internal circuits in the semiconductor device. The timing adjusting circuit is inserted into an input node of a predetermined circuit element, and adjusts a delay amount of an input signal into the predetermined circuit element in accordance with a comparison result of the process monitor circuit. This makes it possible to secure an operation margin of the predetermined circuit element due to process variation.

There are disclosed techniques listed below.
[Patent Document 1] Japanese Unexamined Patent Application Publication No. 2002-359289

SUMMARY

By appropriately controlling body bias of a MOS transistor included in various kinds of internal circuits of a semiconductor device, it becomes possible to reduce variation in electrical characteristics between semiconductor devices, which may occur due to process variation in the semiconductor devices. As the variation in the electrical characteristics, variation in operation speed, variation in a leakage current, and the like can be cited. Further, in order to properly control the body bias, it is necessary to have a mechanism to evaluate how much the process variation occurs in the various kinds of internal circuits of the manufactured semiconductor device.

As one of such a mechanism, a method is known in which a single MOS transistor or the like, which is a test element, is separately provided in the semiconductor device. In this case, electrical characteristics of the test element are measured using a tester or the like. However, the test element generally has a device structure different from that of the MOS transistor constituting the various kinds of internal circuits of the semiconductor device, and is arranged at a position away from the various kinds of internal circuits. Moreover, the influence of the process variation is manifested on average by a plurality of elements in the various kinds of internal circuits, whereas it is manifested by a single element in the test element. Due to such a difference, there is a possibility that the test element cannot evaluate the process variation caused in the various kinds of internal circuits of the semiconductor device with high accuracy.

Therefore, as described in Patent Document 1, a method of providing a process monitor circuit including a ring oscillator composed of a plurality of stages of inverters can be considered. However, in such a process monitor circuit, it is difficult to distinguish and evaluate the process variation of two types of MOS transistors having different conductive types. For this reason, for example, even in a case where operation speed is actually reduced due to the process variation of one MOS transistor, it is necessary to control the body bias so as to increase the operation speed for both MOS transistors. As a result, since excessive body bias control is executed in the other MOS transistor, there is a possibility that another electrical characteristic may be deteriorated, for example, an increase in a leakage current.

The other object and new feature will become apparent from description of the present specification and the accompanying drawings.

A semiconductor device according to one embodiment includes a target circuit, first and second process monitor circuits, a speed measuring circuit, memory, and a body bias controller. The target circuit is configured to execute a desired logic operation, the target circuit including a first conductivity-type transistor to which a first body bias is applied and a second conductivity-type transistor to which a second body bias is applied. The first process monitor circuit includes a first conductivity-type transistor and a second conductivity-type transistor each having a same device structure as that in the target circuit, and operation speed of the first process monitor circuit changes due to an influence of process variation of the first conductivity-type transistor rather than the second conductivity-type transistor. The second process monitor circuit includes a first conductivity-type transistor and a second conductivity-type transistor each having a same device structure as that in the target circuit, and operation speed of the second process monitor circuit changes due to an influence of process variation of the second conductivity-type transistor rather than the first conductivity-type transistor. The speed measuring circuit is configured to measure the operation speed of the first process monitor circuit as a first speed value, and measure the operation speed of the second process monitor circuit as a second speed value. The memory is configured to hold speed/bias data representing a correspondence relationship between the operation speed of the first process monitor circuit and the operation speed of the second process monitor circuit, and a first set value of the first body bias and a second set value of the second body bias. The body bias controller is configured to receive the first speed value and the second speed value measured by the speed measuring circuit of the first process monitor circuit and the second process monitor circuit to which the first body bias and the second body bias based on default values are respectively applied, and obtain the first set value and the second set value on a basis of the speed/bias data.

According to the one embodiment, it is possible to properly control body bias of a transistor even in a case where process variation occurs.

DETAILED DESCRIPTION

Figure 1:
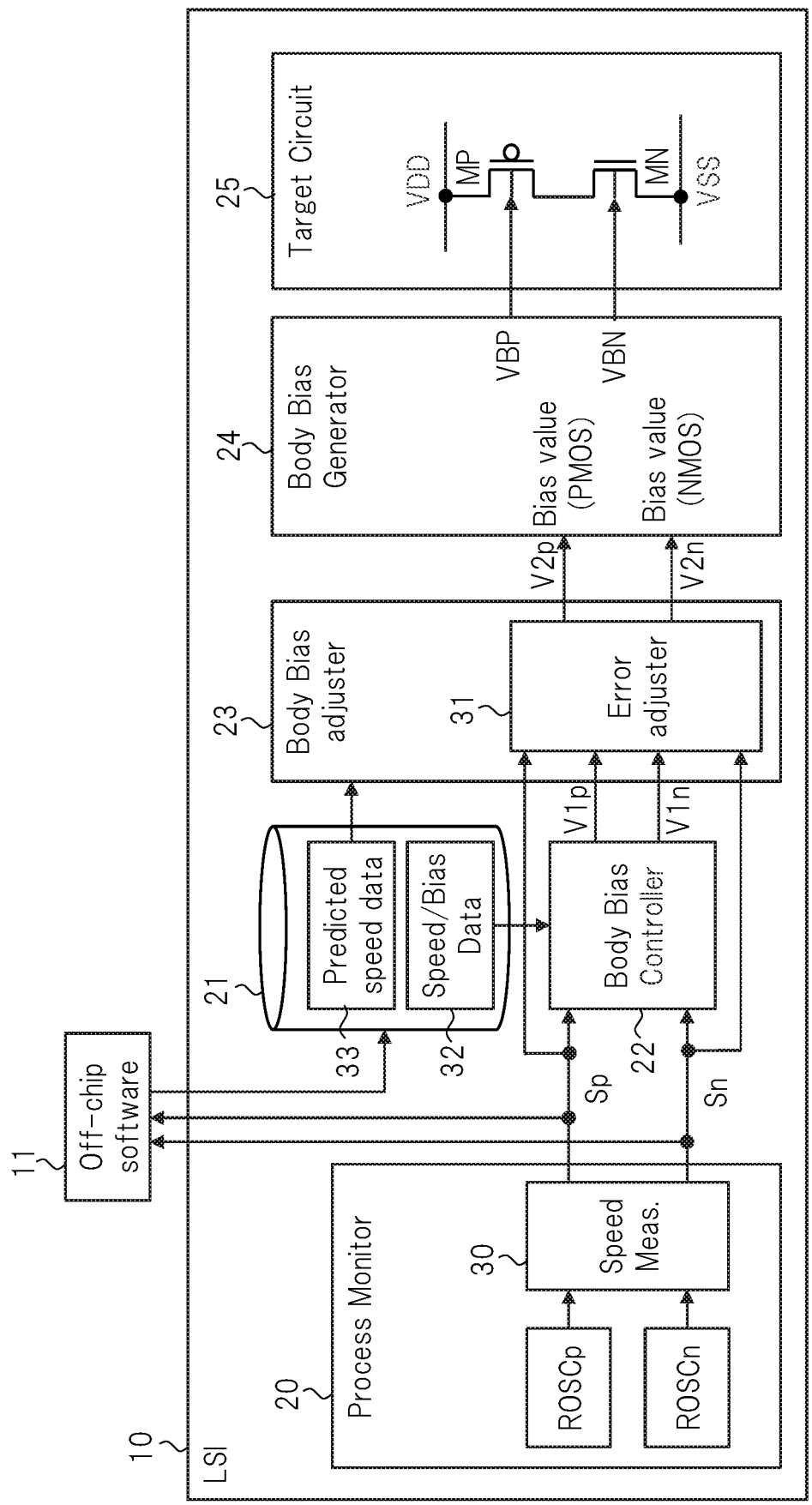
FIG. 1 is a schematic view illustrating a configuration example of a semiconductor device according to a first embodiment.

In embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Further, in the embodiments described below, in a case of referring to the number of elements (including number of pieces, values, amount, range, and the like), the number of the elements is not limited to a specific number unless otherwise stated or except the case where the number is apparently limited to a specific number in principle, and the number larger or smaller than the specific number may also be applicable.

Moreover, in the embodiments described below, it goes without saying that the components (including element steps and the like) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, in embodiments, a MOSFET (Metal Oxide Semiconductor Field Effect Transistor) (hereinafter, abbreviated as a "MOS transistor") is used as one example of a MISFET (Metal Insulator Semiconductor Field Effect Transistor), but a non-oxidizing film is not excluded as a gate insulating film. In the drawings, a p-channel type MOS transistor (PMOS transistor) is distinguished from an n-channel type MOS transistor (NMOS transistor) by attaching an arrow symbol to a gate of the p-channel type MOS transistor.

Hereinafter, embodiments of the present invention will be described in detail with reference to the drawings. Note that in all of the drawings for explaining the embodiments, in general, the same reference numeral is assigned to the same member, and repeated explanation thereof will be omitted.

First Embodiment

<Outline of Semiconductor Device>

Figure 2A:
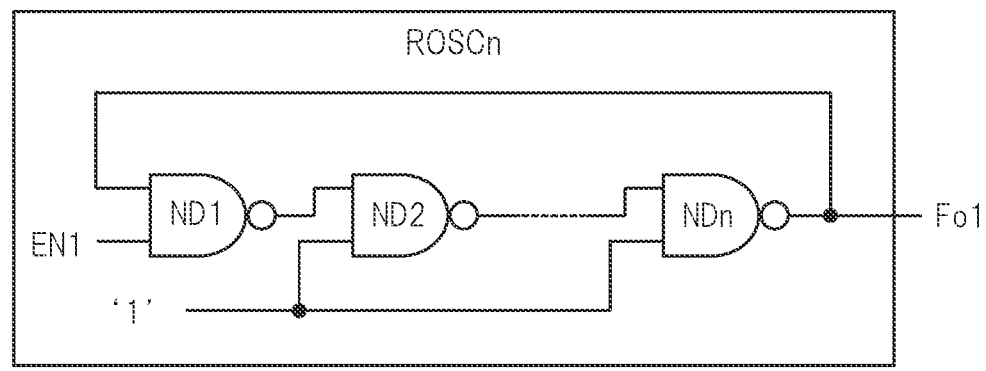
FIG. 2A is a circuit diagram illustrating a configuration example of a process monitor circuit illustrated in FIG. 1.
Figure 2B:
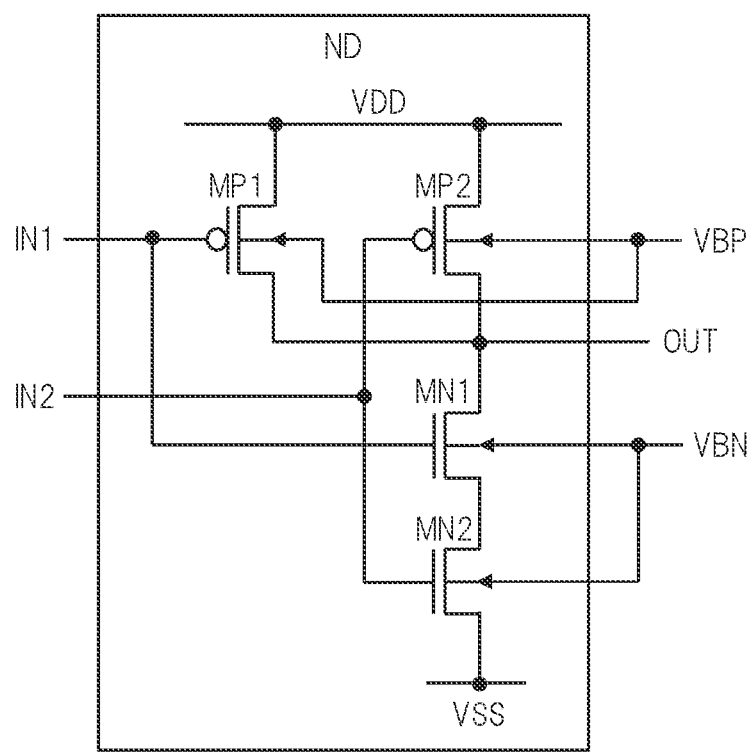
FIG. 2B is a circuit diagram illustrating a configuration example of a NAND gate illustrated in FIG. 2A.
Figure 3A:
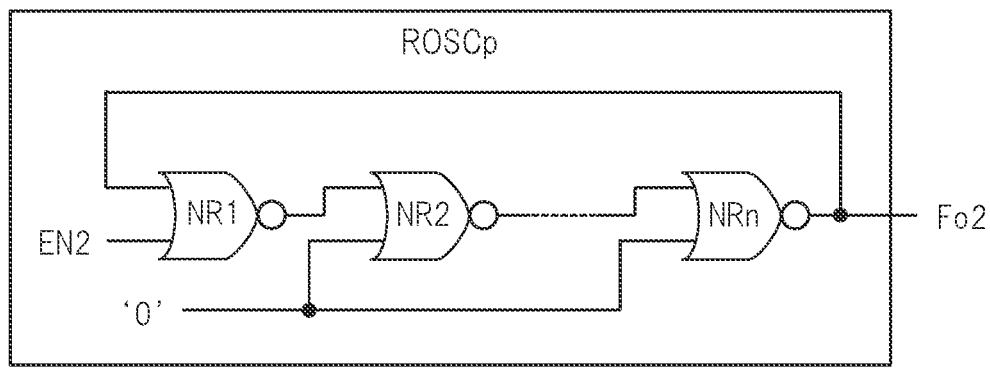
FIG. 3A is a circuit diagram illustrating a configuration example of another process monitor circuit in FIG. 1.
Figure 3B:
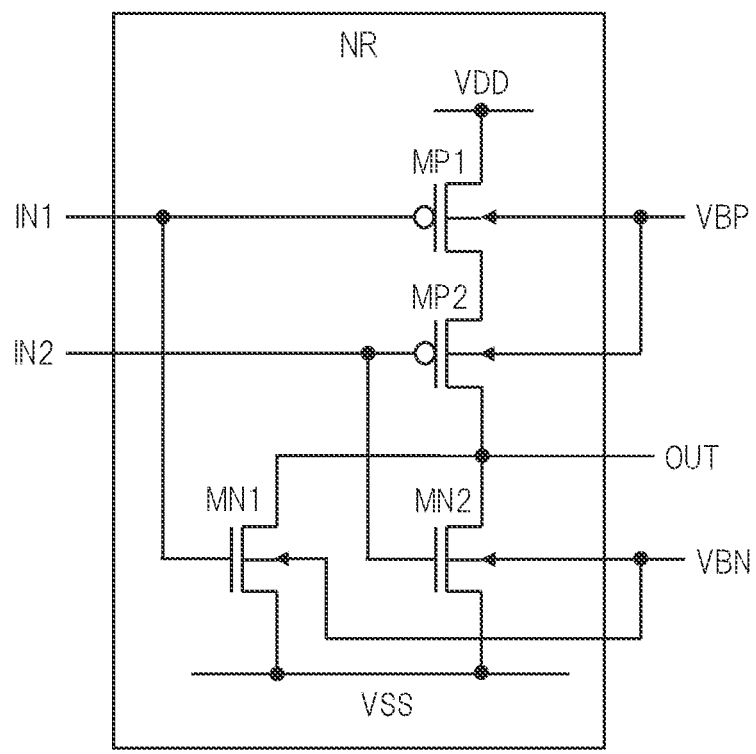
FIG. 3B is a circuit diagram illustrating a configuration example of a NOR gate illustrated in FIG. 3A.

FIG. 1 is a schematic view illustrating a configuration example of a semiconductor device according to a first embodiment. FIG. 2A is a circuit diagram illustrating a configuration example of a process monitor circuit illustrated in FIG. 1, and FIG. 2B is a circuit diagram illustrating a configuration example of a NAND gate illustrated in FIG. 2A. FIG. 3A is a circuit diagram illustrating a configuration example of another process monitor circuit in FIG. 1, and FIG. 3B is a circuit diagram illustrating a configuration example of a NOR gate illustrated in FIG. 3A.

A semiconductor device 10 illustrated in FIG. 1 is composed of one semiconductor chip, for example. The semiconductor device 10 includes a process monitor 20, a memory 21, a body bias controller 22, a body bias adjuster 23, a body bias generator 24, and a target circuit 25. The target circuit 25 includes various kinds of logic circuits, and executes a desired logic operation that bears a function of the semiconductor device 10.

The target circuit 25 includes a CMOS (Complementary MOS) inverter composed of an NMOS transistor MN and a PMOS transistor MP. In the NMOS transistor MN, low potential side power supply voltage VSS is applied to a source thereof, and body bias VBN is applied to a body thereof. In the PMOS transistor MP, high potential side power supply voltage VDD is applied to a source thereof, and body bias VBP is applied to a body thereof.

The process monitor 20 is a circuit for evaluating process variation that occurs in the target circuit 25. Although its illustration is omitted, the process monitor 20 is arranged in a formation region of the target circuit 25, for example. The process monitor 20 includes two process monitor circuits and a speed measuring circuit 30. The two process monitor circuits are two ring oscillators ROSCn and ROSCp, for example. Each of the two process monitor circuits includes an NMOS transistor MN and a PMOS transistor MP each of which has the same device structure as that in the target circuit 25.

Here, as illustrated in FIG. 2A, the ring oscillator (first process monitor circuit) ROSCn is composed of a plurality of stages of NAND gates ND1, ND2, . . . , and NDn, for example. Each of the second to the last NAND gates ND2, . . . , and NDn operates as an inverter by fixing one of two inputs to a '1' level. Further, an enable signal EN1 is inputted into one of two inputs of the first the NAND gate ND1. The ring oscillator ROSCn starts an oscillation operation by changing the enable signal EN1 from a '0' level to a '1' level, and outputs an oscillation signal Fo1.

As illustrated in FIG. 2B, each of the NAND gates ND illustrated in FIG. 2A receives two input signals IN1 and IN2 to execute a NAND operation, and outputs an output signal OUT that becomes a calculation result. The NAND gate ND includes two NMOS transistors MN1 and MN2 to each of which the body bias VBN is applied, and two PMOS transistors MP1 and MP2 to each of which the body bias VBP is applied. Here, the two PMOS transistors MP1 and MP2 are connected in parallel, whereas the two NMOS transistors MN1 and MN2 are connected in series. For this reason, the NAND gate ND, and eventually the ring oscillator ROSCn, is a circuit whose operation speed changes due to influence of the process variation of the NMOS transistor MN rather than the PMOS transistor MP.

On the other hand, as illustrated in FIG. 3A, for example, the ring oscillator (a second process monitor circuit) ROSCp is composed of a plurality of stages of NOR gates NR1, NR2, . . . , and NRn. Each of the second to the last NOR gates NR2, . . . , and NRn operates as an inverter by fixing one of two inputs to a '0' level. Further, an enable signal EN2 is inputted into one of the two inputs of the first NOR gate NR1. The ring oscillator ROSCp starts an oscillation operation by changing the enable signal EN2 from a '1' level to the '0' level, and outputs an oscillation signal Fo2.

As illustrated in FIG. 3B, each NOR gate NR illustrated in FIG. 3A receives the two input signals IN1 and IN2, executes a NOR operation, and outputs the output signal OUT that becomes a calculation result. The NOR gate NR includes the two NMOS transistors MN1 and MN2 to which the body bias VBN is applied, and the two PMOS transistors MP1 and MP2 to which the body bias VBP is applied. Here, the two NMOS transistors MN1 and MN2 are connected in parallel, whereas the two PMOS transistors MP1 and MP2 are connected in series. For this reason, the NOR gate NR, and thus the ring oscillator ROSCp is a circuit whose operating speed changes due to the influence of the process variation of the PMOS transistor MP rather than the NMOS transistor MN.

Returning to FIG. 1, the speed measuring circuit 30 in the process monitor 20 measures operation speed of the ring oscillator ROSCn as a speed value Sn, and measures operation speed of the ring oscillator ROSCp as a speed value Sp. The speed values Sn and Sp are oscillation frequency of the ring oscillator, a delay amount of each logic gate defined from the oscillation frequency, and the like, for example. The speed measuring circuit 30 is composed of two counters that executes a counting operation in synchronization with the oscillation signals Fo1 and Fo2 from the ring oscillators ROSCn and ROSCp, for example.

For example, the memory 21 is composed of a combination of a non-volatile memory such as a flash memory and a volatile memory such as a DRAM or SRAM. The memory 21 holds speed/bias data 32 and predicted speed data 33, which are generated in advance using external software 11 of the semiconductor device 10. Although the details will be described later, the speed/bias data 32 represents a correspondence relationship between each operation speed of the ring oscillators ROSCn and ROSCp and set values of the body biases VBN and VBP. The predicted speed data 33 represents a predicted region of each operation speed of the ring oscillators ROSCn and ROSCp, which is predicted in a case where the body biases VBN and VBP based on a plurality of set values contained in the speed/bias data 32 are respectively applied.

The speed measuring circuit 30 measures the speed values Sn and Sp for the ring oscillators ROSCn and ROSCp to which the body biases VBN and VBP based on a default value are respectively applied. Then, the body bias controller 22 receives the measured speed values Sn and Sp, and obtains set values V1$n$ and V1$p$ of the body biases VBN and VBP on the basis of the speed/bias data 32 in the memory 21.

The body bias adjuster 23 adjusts the set values V1$n$ and V1$p$ of the body biases VBN and VBP obtained by the body bias controller 22. Specifically, the body bias adjuster 23 includes an error adjuster 31. Here, the speed measuring circuit 30 measures the speed values Sn and Sp for the ring oscillators ROSCn and ROSCp to which the body biases VBN and VBP based on the set values V1$n$ and V1$p$ from the body bias controller 22 are respectively applied. The error adjuster 31 receives the measured the speed values Sn and Sp, and adjusts one or both of the two set values V1$n$ and V1$p$ obtained by the body bias controller 22 in a case where the speed values Sn and Sp are not included in a predicted area represented by the predicted speed data 33.

The body bias generator 24 receives set values V2$n$ and V2$p$ after adjustment from the body bias adjuster 23, here the error adjuster 31, and generates the body biases VBN and VBP on the basis of the set values V2$n$ and V2$p$ after the adjustment. The generated body biases VBN and VBP are at least supplied to the target circuit 25 and the ring oscillators ROSCn and ROSCp in the process monitor 20.

Note that the body bias adjuster 23 can specifically output the set values V1$n$ and V1$p$ to the body bias generator 24 as they are as the set values V2$n$ and V2$p$ after adjustment without adjustment of the set values V1$n$ and V1$p$ from the body bias controller 22. For this reason, the body bias generator 24 can also generate the body biases VBN and VBP on the basis of the set values V1$n$ and V1$p$. Further, in a case where the set values V1$n$ and V1$p$ are default values, the body bias generator 24 generates the body biases VBN and VBP on the basis of the default values.

The body bias controller 22 and the body bias adjuster 23 are realized, for example, by a logic circuit or program processing by a processor. Namely, for example, in a case where the semiconductor device 10 is a microcontroller or a SoC (System on Chip), the body bias controller 22 and the body bias adjuster 23 may be realized by using a processor mounted on the semiconductor device 10. The body bias generator 24 is composed of a digital-to-analog converter or the like, for example.

Figure 4A:
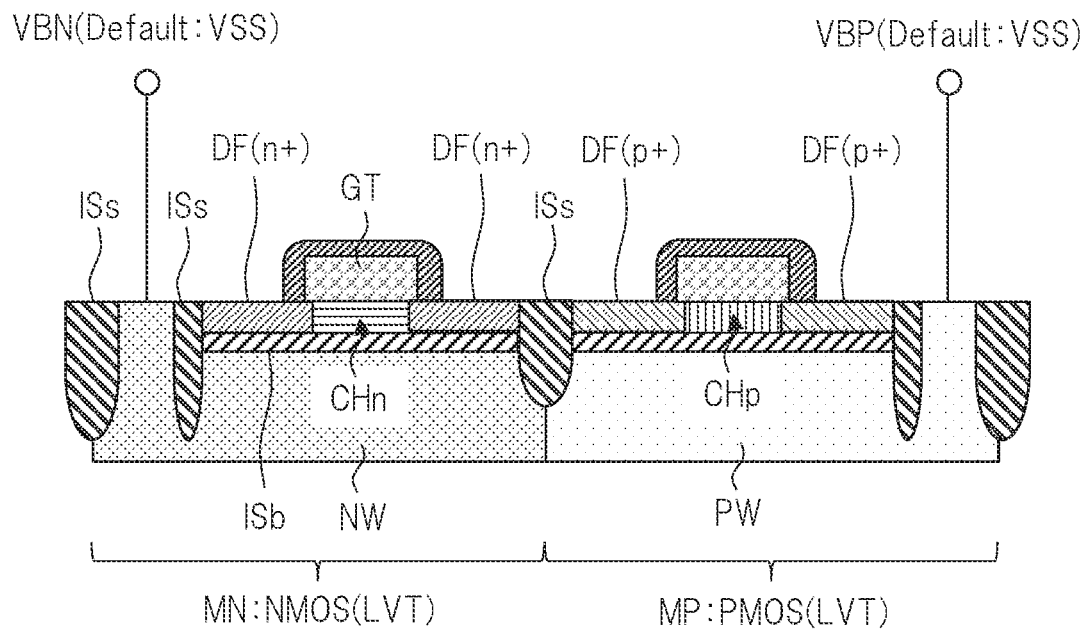
FIG. 4A is a sectional view illustrating one example of a device structure of a transistor included in a target circuit and the process monitor illustrated in FIG. 1.
Figure 4B:
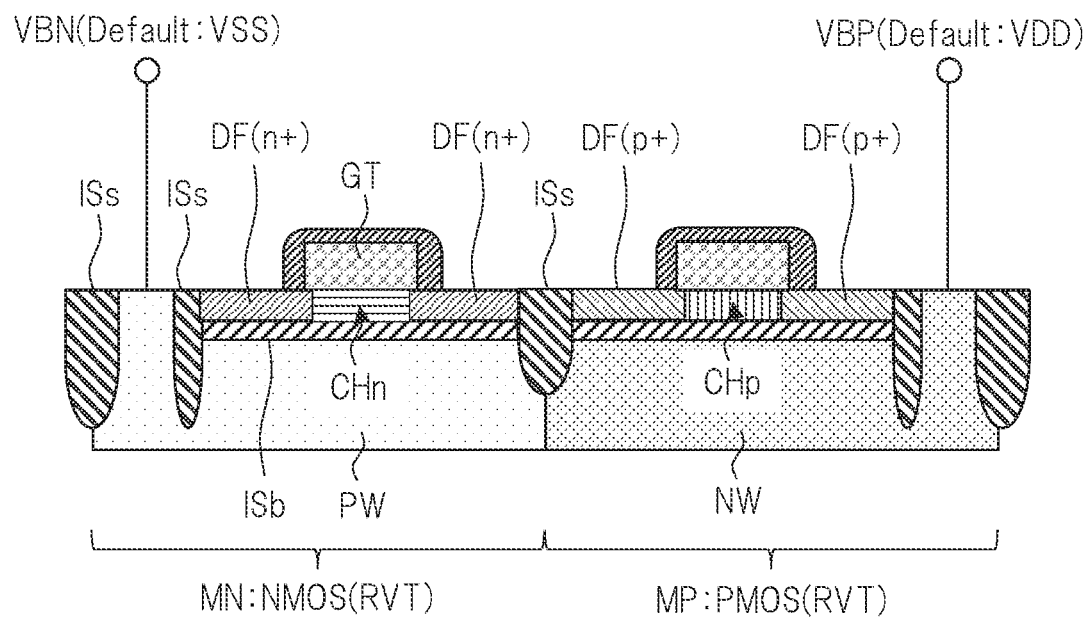
FIG. 4B is a sectional view illustrating one example of a device structure different from that illustrated in FIG. 4A.

FIG. 4A is a sectional view illustrating one example of a device structure of the transistors included in the target circuit and the process monitor in FIG. 1. FIG. 4B is a sectional view illustrating one example of a device structure different from that illustrated in FIG. 4A. Each of the NMOS transistor MN and the PMOS transistor MP illustrated in FIG. 4A is formed of a low threshold voltage (LVT) type SOI (Silicon on Insulator) structure. On the other hand, each of the NMOS transistor MN and the PMOS transistor MP illustrated in FIG. 4B is formed of a standard threshold voltage (RVT) type SOI structure.

In FIG. 4A, in the NMOS transistor MN, two n+ type diffusion layers DF (n+) serving as sources or drains are formed on an n type well NW with a barrier insulating film ISb interposed therebetween. An n-channel domain CHn is formed between the two diffusion layers DF (n+). A gate layer GT is formed on the upper part of the n-channel domain CHn with a gate insulating film interposed therebetween.

On the other hand, in the PMOS transistor MP, two p+ type diffusion layers DF (p+) serving as sources or drains are formed on a p type well PW with a barrier insulating film ISb interposed therebetween. A p-channel domain CHp is formed between the two diffusion layers DF (p+). A gate layer GT is formed on the upper part of the p-channel domain CHp with a gate insulating film interposed therebetween. Note that each domain and each layer are appropriately separated by separation insulating films ISs.

Here, the body bias VBN is applied to the n type well NW constituting the NMOS transistor MN. The body bias VBP is applied to the p type well PW constituting the PMOS transistor MP. Both the body biases VBN and VBP are set to a value of the low potential side power supply voltage VSS, for example, 0 V as default values. Such an LVT type structure is mainly used for high speed.

The structure illustrated in FIG. 4B has a different well type as compared with the structure illustrated in FIG. 4A. Namely, an NMOS transistor MN is formed on a p type well PW, and a PMOS transistor MP is formed on an n type well NW. The body bias VBN is applied to the p type well PW constituting the NMOS transistor MN. The body bias VBP is applied to the n type well NW constituting the PMOS transistor MP.

The body bias VBN is set to a value of the low potential side power supply voltage VSS, for example, 0 V as a default value. On the other hand, the body bias VBP is set to a value of the high potential side power supply voltage VDD as a default value. The value of the high potential side power supply voltage VDD is typically 1.0 V or the like. Such an RVT type structure is mainly used for reducing the leakage current and thus for reducing the power consumption.

Note that the NMOS transistor MN and the PMOS transistor MP are not limited to such an SOI structure, and may be a bulk structure in which the barrier insulating film ISb is not formed. However, the SOI structure generally has a larger body bias effect than the bulk structure. For this reason, by using the SOI structure, it is possible to further improve the control efficiency of the body bias as compared with the case of using the bulk structure.

<Method for Controlling Body Bias According to Comparative Example>

Figure 16:
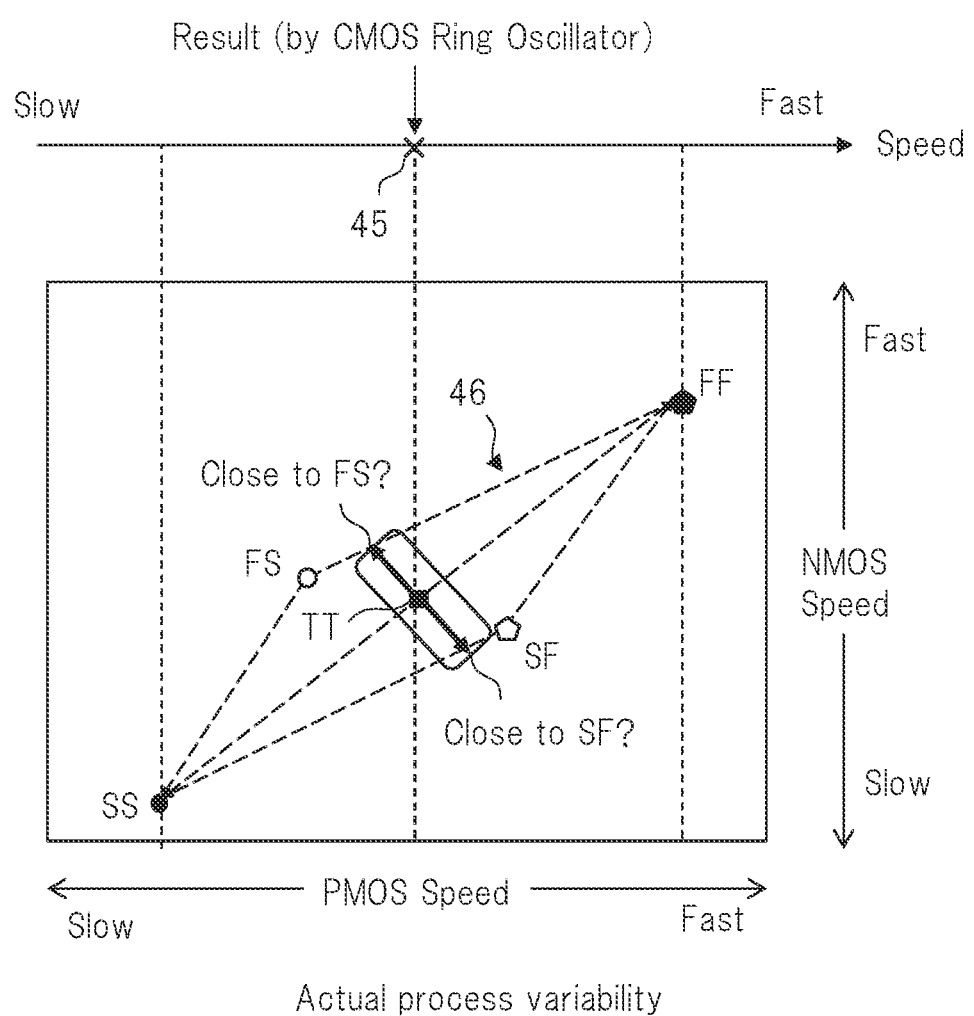
FIG. 16 is a conceptual diagram for explaining a method for controlling body bias according to a comparative example and one example of problems thereof.

FIG. 16 is a conceptual diagram for explaining a method for controlling a body bias according to a comparative example and one example of its problems. For example, in a case where a ring oscillator composed of a CMOS inverter is used as a process monitor circuit, a speed value of the ring oscillator can be obtained as a monitoring result. In the example of FIG. 16, a standard speed value of 45 is obtained. Further, FIG. 16 illustrates a two-dimensional speed space in which operation speed of an NMOS transistor and operation speed of a PMOS transistor are variables. Here, a vertical axis is the operation speed of the NMOS transistor, and a horizontal axis is the operation speed of the PMOS transistor. Further, a variation region 46 that can be caused by process variation of the ring oscillator is illustrated within the two-dimensional speed space.

In the variation region 46, "FF" represents a plot point at which both the operation speed of the NMOS transistor and the operation speed of the PMOS transistor become the fastest. Namely, "FF" means that the process variation has occurred in the NMOS transistor and the PMOS transistor so as to be located at this fastest plot point. Similarly, "SS" represents a plot point at which both the operation speed of the NMOS transistor and the operation speed of the PMOS transistor become the slowest, and "TT" represents a plot point at which both the operation speed of the NMOS transistor and the operation speed of the PMOS transistor become standard.

Further, "FS" represents a plot point at which the operation speed of the NMOS transistor becomes the fastest and the operation speed of the PMOS transistor become the slowest. On the contrary, "SF" represents a plot point at which the operation speed of the NMOS transistor becomes the slowest and the operation speed of the PMOS transistor become the fastest. The variation region 46 is a region surrounded by "FF", "FS", "SS", and "SF". As illustrated in FIG. 16, the variation region 46 can be a parallelogram close to a diamond shape rather than a simple quadrangle. In a case where process variation occurs in the NMOS transistor and the PMOS transistor, a plot point is generated at any position in the variation region 46 depending on the degree of the variation.

Here, as illustrated in FIG. 16, in a case where a standard speed value of 45 is obtained, the standard speed value of 45 is not always obtained only when the process variation of the NMOS transistor and the PMOS transistor is "TT". Specifically, the standard speed value of 45 can be obtained when the process variation is closer to "FS" with respect to "TT" or closer to "SF".

However, in a case where the ring oscillator composed of the CMOS inverter is used, it is difficult to determine such closer to "FS" or closer to "SF". As a result, for example, in a case where a designer wants to bring a device by which the standard speed value of 45 is obtained closer to "FF", it is necessary to symmetrically apply body biases to both the NMOS transistor and the PMOS transistor so as to increase the operation speed. At this time, if the device is actually closer to "FS", a control is executed to further increase the operation speed of the NMOS transistor whose operation speed is originally high.

As described above, in a case where the ring oscillator composed of the CMOS inverter is used, it may be difficult to properly control the body bias. Namely, in the example described above, as a result of an excessive control of the body bias for the NMOS transistor, an increase in a leakage current or the like may occur. The operation speed and the leakage current are usually in a trade-off relationship. It is desired to control the body bias so as to properly balance the operation speed and the leakage current.

<Details Around Body Bias Controller>

Figure 5:
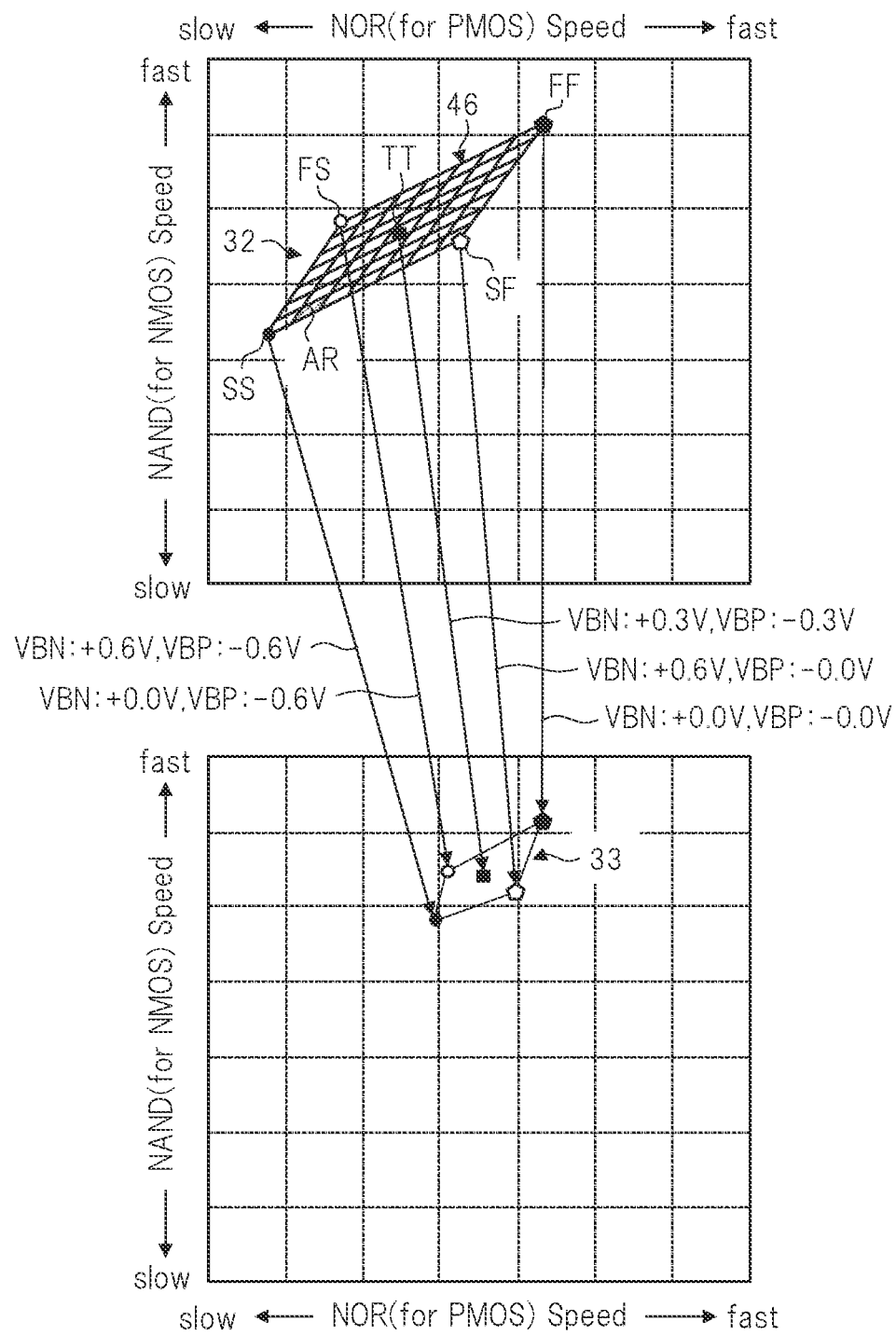
FIG. 5 is a view illustrating an operation example of a body bias controller illustrated in FIG. 1 and a configuration example of speed/bias data and predicted speed data.
Figure 6:
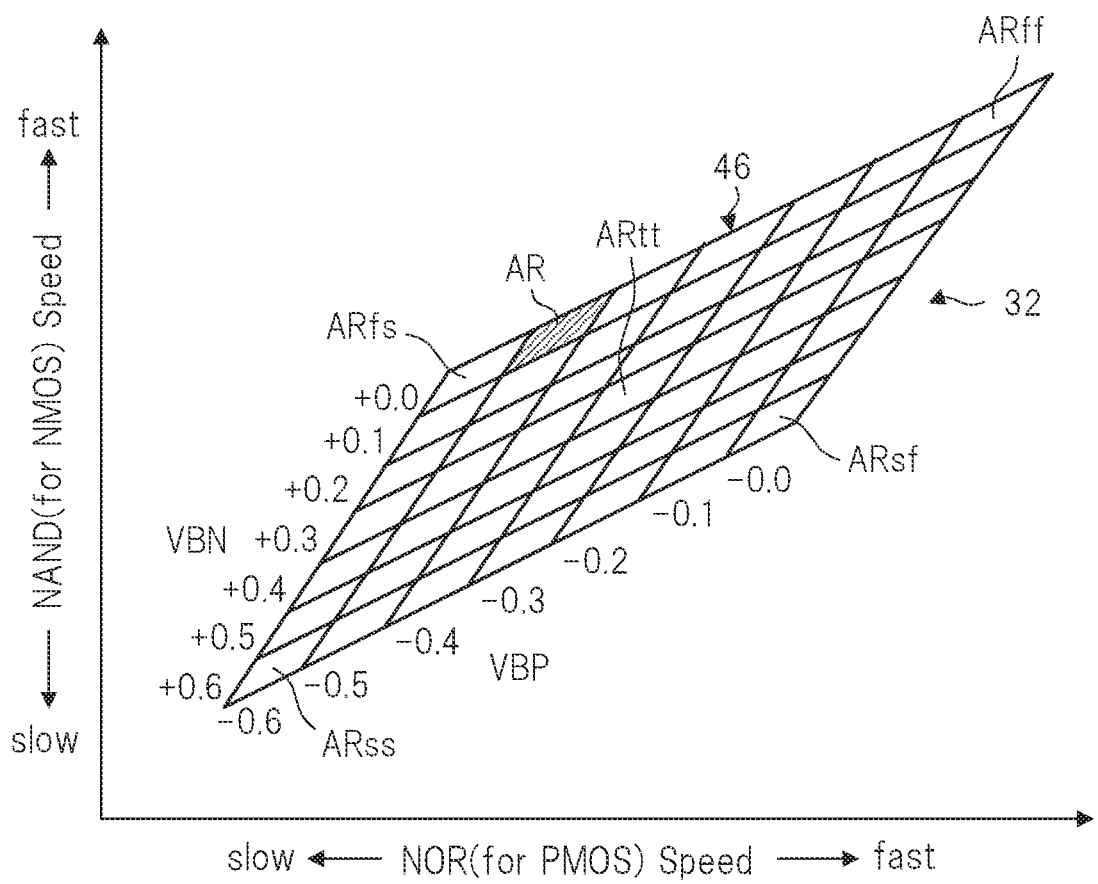
FIG. 6 is a view illustrating a more detailed configuration example of the speed/bias data in FIG. 5.

FIG. 5 is a view illustrating an operation example of the body bias controller illustrated in FIG. 1 and a configuration example of speed/bias data and predicted speed data. FIG. 6 is a view illustrating a more detailed configuration example of the speed/bias data in FIG. 5. FIG. 5 illustrates a two-dimensional speed space in which operation speed of the NAND type ring oscillator ROSCn illustrated in FIG. 2A, that is, the NMOS transistor MN, and operation speed of the NOR type ring oscillator ROSCp illustrated in FIG. 3A, that is, the PMOS transistor MP are variables. Here, a vertical axis is the operation speed of the NMOS transistor MN, and a horizontal axis is the operation speed of the PMOS transistor MP.

Further, similarly to the case of FIG. 16, a variation region 46 that can be caused by process variation of the NMOS transistor MN and the PMOS transistor MP is illustrated within the two-dimensional speed space. The variation region 46 is divided into a plurality of division regions AR. Each division region AR becomes a parallelogram close to a rhombic shape by reflecting a shape of the variation region 46. Further, as illustrated in FIG. 6, a set value of the body bias VBN and a set value of the body bias VBP are determined for each of the plurality of division regions AR. In this manner, the speed/bias data 32 are configured by defining the variation region 46 within the two-dimensional speed space, divides the variation region 46 into the plurality of division regions AR, and determining the set values of the body biases VBN and VBP for each of the plurality of division regions AR.

FIG. 6 illustrates a concrete example of the set values of the body biases VBN and VBP when the operation speed of each semiconductor device 10 is adjusted to "FF" on the assumption that the NMOS transistor MN and the PMOS transistor MP are formed by the LVT type SOI structure illustrated in FIG. 4A. The variation region 46 is composed of a total of 49 divided regions AR by being divided into 7 in both the vertical axis direction and the horizontal axis direction. The 49 division regions AR includes an FF region ARff, a TT region ARtt, an SS region ARss, an FS region ARfs, and an SF region ARsf, which respectively correspond to "FF", "TT", "SS", "FS", and "SF" described in FIG. 16.

The set value of the body bias VBN becomes +0.0 V, which is a default value, in a case where the operation speed of the NMOS transistor MN is the fastest. The set value of the body bias VBN increases in +0.1 V steps as the operation speed becomes slower, and becomes +0.6 V in a case where the operation speed is the slowest. On the other hand, the set value of the body bias VBP becomes −0.0 V, which is a default value, in a case where the operation speed of the PMOS transistor MP is the fastest. The set value of the body bias VBP decreases in −0.1 V steps as the operation speed becomes slower, and becomes −0.6 V in a case where the operation speed is the slowest.

In this case, the set values of the body biases VBN/VBP are set so that the absolute values are equal, such as +0.0 V/−0.0 V and +0.6 V/−0.6 V, in the FF region ARff and the SS region ARss. Further, the set values of the body biases VBN/VBP are set in the FS region ARfs so that the body bias VBN becomes +0.0 V and the body bias VBP becomes −0.6 V, and are set in the SF region ARsf so that the body bias VBP becomes −0.0 V and the body bias VBN becomes +0.6 V. According to the inspection by the inventors of the present application, it has been confirmed that an increase in the leakage current generated when the operation speed is increased can be minimized by using such set values of the body biases VBN/VBP.

Here, the body bias controller 22 illustrated in FIG. 1 receives the speed values Sn and Sp measured by the speed measuring circuit 30 for the ring oscillators ROSCn and ROSCp to which the body biases VBN and VBP based on the default values are applied. The speed values Sn and Sp are plotted in any one of the 49 division regions AR included in the variation region 46 illustrated in FIG. 5. Therefore, the body bias controller 22 receives the speed values Sn and Sp, and obtains the set values V1n/V1p of the body biases VBN/VBP corresponding to the speed values Sn and Sp on the basis of the speed/bias data 32.

The obtained set values V1n/V1p are +0.0 V/−0.0 V in a case where the plot point of the speed values Sn and Sp is in the FF region ARff, and are +0.6 V/−0.6 V in a case where the plot point is in the SS region ARss. Further, the obtained set values V1n/V1p are +0.0 V/−0.6 V in a case where the plot point of the speed values Sn and Sp is in the FS region ARfs, and are +0.6 V/−0.0 V in a case where the plot point is in the SF region ARsf. Moreover, the obtained set value V1n/V1p are +0.3 V/−0.3 V in a case where the plot point of the speed values Sn and Sp is in the TT region ARtt.

By applying the body biases VBN and VBP to the ring oscillators ROSCn and ROSCp based on the set values V1n/V1p obtained in this manner, all the operation speeds of the ring oscillators ROSCn and ROSCp, which were "TT", "SS", "FS", and "SF", can be brought closer to "FF". As a result, the predicted speed data 33 as illustrated in FIG. 5 is ideally obtained. Namely, the predicted speed data 33 represents predicted areas of the operation speeds of the ring oscillators ROSCn and ROSCp, which is predicted when the body biases VBN and VBP based on the plurality of set values contained in the speed/bias data 32 are respectively applied.

Note that with reference to FIG. 5 and FIG. 6, the description has been made on the assumption of a case where a FBB (Forward Back Bias) control is executed to bring the operation speed of the semiconductor device 10, which is slowed down due to the process variation, closer to "FF". On the other hand, in the same manner as this, by providing another speed/bias data 32 and another predicted speed data 33, it is possible to execute a RBB (Reverse Back Bias) control for bringing the operation speed of the semiconductor device 10 closer to "SS" and thus minimizing the leakage current. Moreover, for example, it is also possible to realize a semiconductor device 10 in which data for FBB and data for RBB are provided and the FBB control and the RBB control are dynamically switched in accordance with the processing content of the target circuit 25.

<Details of Error Adjuster>

Figure 7:
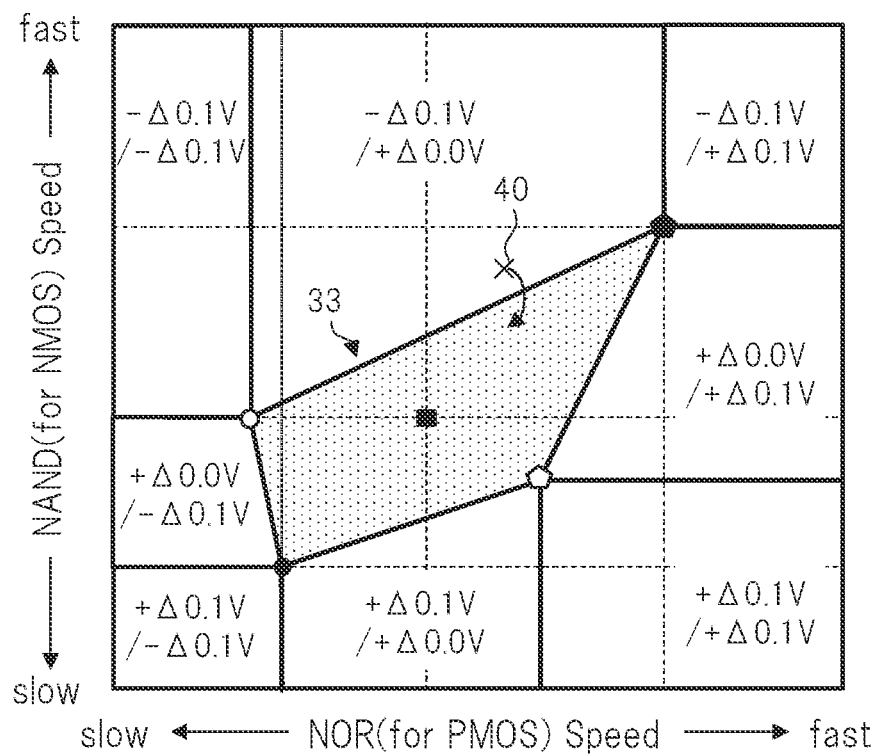
FIG. 7 is a schematic view illustrating an operation example of an error adjuster illustrated in FIG. 1.

FIG. 7 is a schematic view illustrating an operation example of the error adjuster illustrated in FIG. 1. As described above, by using the body bias controller 22, operation speed of each semiconductor device 10 is ideally controlled in the predicted area represented by the predicted speed data 33 illustrated in FIG. 5. However, in actual, for example, the operation speed of the semiconductor device 10 may not be included in the predicted area due to factors such as variation in accuracy of the body bias generator 24 illustrated in FIG. 1 and aging deterioration of the semiconductor device 10.

Therefore, the speed measuring circuit 30 illustrated in FIG. 1 measures the speed values Sn and Sp for the ring oscillators ROSCn and ROSCp to which the body biases VBN and VBP based on the set values V1n and V1p from the body bias controller 22 are applied. The error adjuster 31 receives the measured speed values Sn and Sp, and adjusts one or both of the set values V1n and V1p obtained by the body bias controller 22 in a case where the speed values Sn and Sp is not included in the predicted area represented by the predicted speed data 33.

Specifically, as illustrated in FIG. 7, the error adjuster 31 adjusts one or both of the set values V1n and V1p by a difference amount defined in advance, ±0.1 V in this example on the basis of a positional relationship between the predicted area represented by the predicted speed data 33 and the plot point represented by the speed values Sn and Sp in the two-dimensional speed space described above. In the example of FIG. 7, a plot point 40 represented by the speed values Sn and Sp is located in a region in which the operation speed of the NMOS transistor is high with respect to the predicted area. In this case, the error adjuster 31 adjusts the set value V1n of the body bias VBN by −Δ0.1 V that is the difference amount defined in advance, and outputs a set value V2n (=V1n−0.1 V) after adjustment and a set value V2p (=V1p) after adjustment.

In the example of FIG. 7, an area around the predicted area is divided into a plurality of regions in advance, and a difference amount is defined for each of the plurality of regions. Specifically, with respect to the predicted area, a difference amount of the body bias VBN is set to −Δ0.1 V in a region in which the operation speed of the NMOS transistor MN is high, and is set to +Δ0.1 V in a region in which the operation speed of the NMOS transistor MN is low. Similarly, with respect to the predicted area, a difference amount of the body bias VBP is set to +Δ0.1 V in a region in which the operation speed of the PMOS transistor MP is high, and is set to −Δ0.1 V in a region in which the operation speed of the PMOS transistor MP is low.

The body bias generator 24 illustrated in FIG. 1 generates the body biases VBN and VBP on the basis of the set values V2n and V2p after adjustment from the error adjuster 31, and applies them to the NMOS transistor MN and the PMOS transistor MP of the target circuit 25. By providing such an error adjuster 31, the body biases VBN and VBP can be controlled properly, in other words, with higher accuracy even in a case where other various variations occur in addition to a case where the process variation occurs.

<Method for Controlling Body Bias According to First Embodiment>

Figure 8:
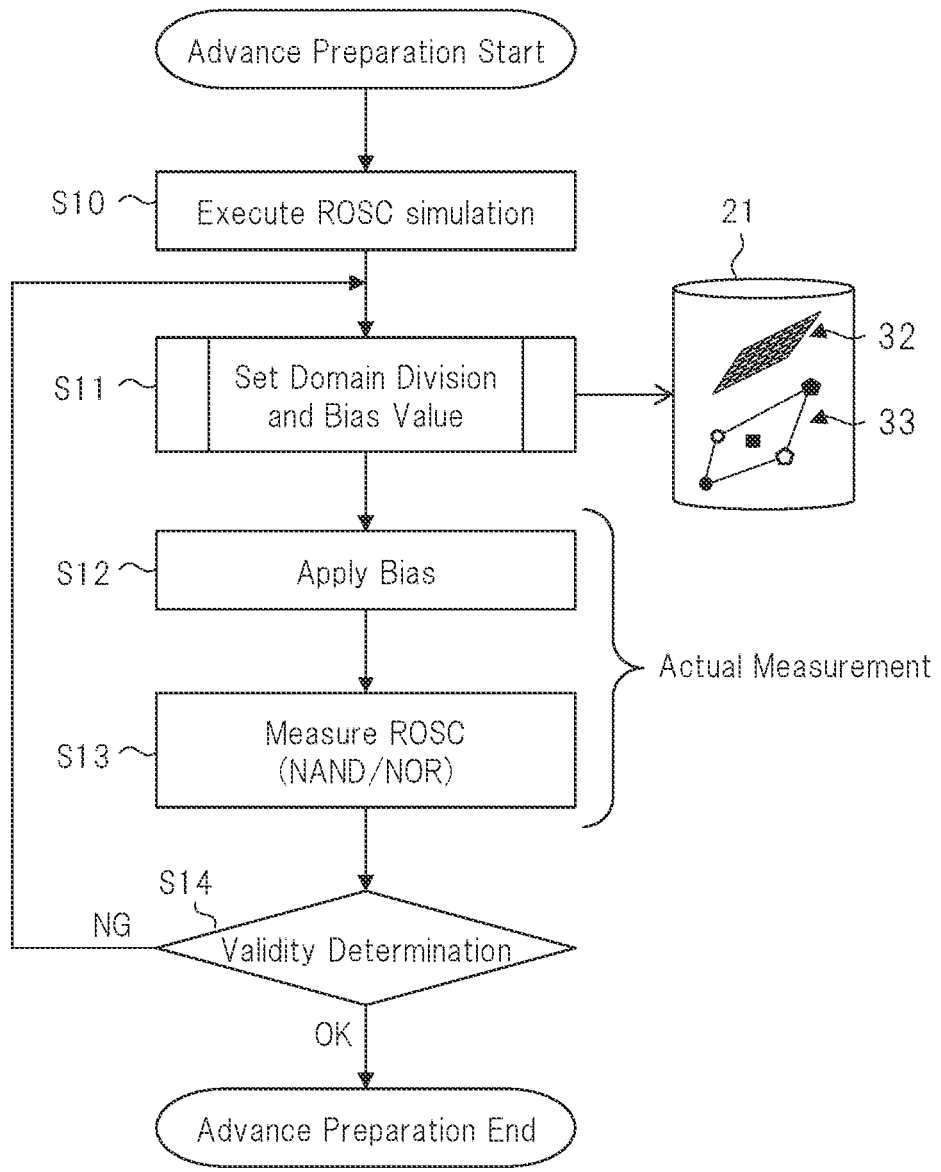
FIG. 8 is a flow diagram illustrating one example of the working content associated with advance preparation in a method for controlling body bias of the semiconductor device according to the first embodiment.
Figure 9:
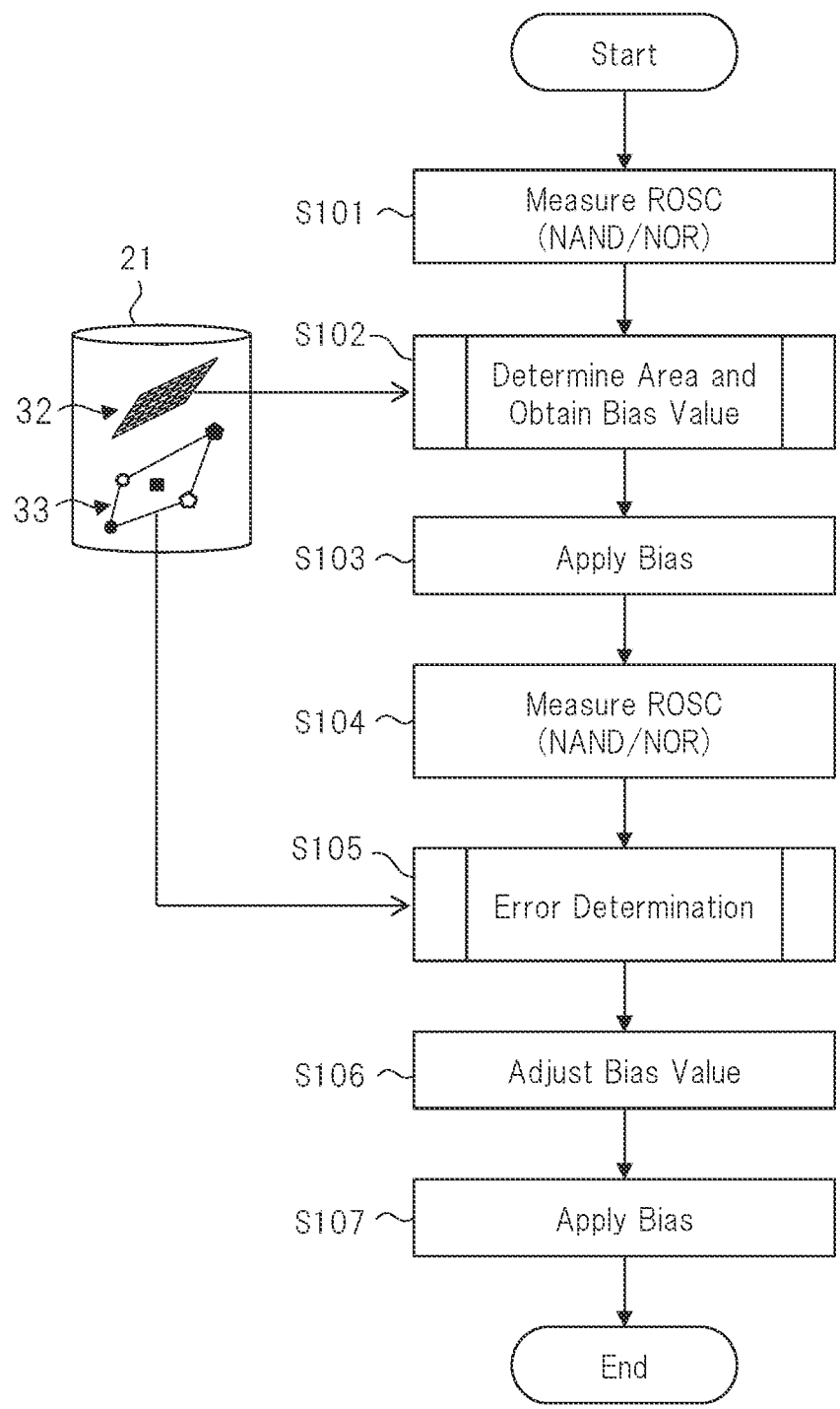
FIG. 9 is a flow diagram illustrating one example of the processing content of the semiconductor device after the advance preparation, which follows FIG. 8.

FIG. 8 is a flow diagram illustrating one example of the working content associated with advance preparation in the method for controlling body bias thereof according to the first embodiment. FIG. 9 is a flow diagram illustrating one example of the processing content of the semiconductor device after the advance preparation, which follows FIG. 8. First, in FIG. 8, a designer uses a simulator or the like to execute simulation of the ring oscillators ROSCp and ROSCn illustrated in FIG. 1 while appropriately changing parameters of a transistor due to process variation and values of the body biases VBN and VBP, for example (Step S10).

Subsequently, the designer creates the speed/bias data 32, the predicted speed data 33 illustrated in FIG. 5, and the like by determining a method for dividing regions or set values of the body biases VBN and VBP on the basis of a simulation result at Step S10 (Step S11). Subsequently, the designer prepares a semiconductor device in which the ring oscillators ROSCn and ROSCp illustrated in FIG. 1 are at least to be formed.

Then, the designer applies the body biases VBN and VBP to the semiconductor device on the basis of the created speed/bias data 32 by using a tester or the like (Step S12), measures operation speeds of the ring oscillators ROSCn and ROSCp each time (Step S13). Further, the designer inspects the degree of coincidence between the measured operation speed and the predicted speed data 33. Note that at Step S13, the designer may measure a leakage current in addition to the operation speed.

As described above, at Steps S12 and S13, the validity of the speed/bias data 32 created by the simulation and the predicted speed data 33 is inspected by actual measurement. Here, in a case where the designer determines that the speed/bias data 32 and the predicted speed data 33 are not valid, the processing flow returns to Step S11 (Step S14). Then, at Step S11, the designer appropriately modifies the method for dividing regions and the set values of the body biases VBN and VBP, and the processing flow repeats the processes at Steps S11 to S14 until valid data are obtained.

The valid speed/bias data 32 and the valid predicted speed data 33 obtained by these processes are data to be held in the memory 21 of the semiconductor device 10 illustrated in FIG. 1. The speed/bias data 32 and the predicted speed data 33 are commonly created for the semiconductor device including the ring oscillators ROSCn and ROSCp and the target circuit 25 having the same transistor specifications.

After the valid speed/bias data 32 and the valid predicted speed data 33 are held in the memory 21 in this manner, in FIG. 9, the speed measuring circuit 30 illustrated in FIG. 1 measures the speed values Sn and Sp of the ring oscillators ROSCn and ROSCp in a state where the body biases VBN and VBP based on the default values are applied thereto (Step S101). Subsequently, as illustrated in FIG. 5, the body bias controller 22 determines a division region AR in which the speed values Sn and Sp are plotted on the basis of the speed/bias data 32 held in the memory 21. Then, the body bias controller 22 obtains the set values V1n and V1p of the body biases VBN and VBP corresponding to the division region AR (Step S102).

Subsequently, the body bias generator 24 generates the body biases VBN and VBP on the basis of the set values V1n and V1p obtained at Step S102, and applies them to the ring oscillators ROSCn and ROSCp and the target circuit 25 (Step S103). Subsequently, the speed measuring circuit 30 measures the speed values Sn and Sp for the ring oscillators ROSCn and ROSCp to which the body biases VBN and VBP are applied at Step S103 (Step S104).

Subsequently, the body bias adjuster 23, specifically, the error adjuster 31 determines whether there is an error in the speed values Sn and Sp measured at Step S104 or not on the basis of the predicted speed data 33 held in the memory 21 (Step S105). Namely, as illustrated in FIG. 7, the error adjuster 31 determines whether the plot point of the speed values Sn and Sp is included in the predicted area represented by the predicted speed data 33 or not.

Then, in a case where it is determined at Step S105 there is an error in the speed values Sn and Sp, the error adjuster 31 adjusts the set values V1n and V1p of the body biases VBN and VBP (Step S106). Namely, as illustrated in FIG. 7, the error adjuster 31 adjusts the set values V1n and V1p so as to become the state where the plot point of the speed values Sn and Sp is included in the predicted area represented by the predicted speed data 33, and outputs the set values V2n and V2p after adjustment. Then, the body bias generator 24 generates the body biases VBN and VBP on the basis of the set values V2n and V2p after adjustment, and applies them to the target circuit 25 and the ring oscillators ROSCn and ROSCp (Step S107).

<Outline Around Semiconductor Device (Modification Example)>

Figure 10:
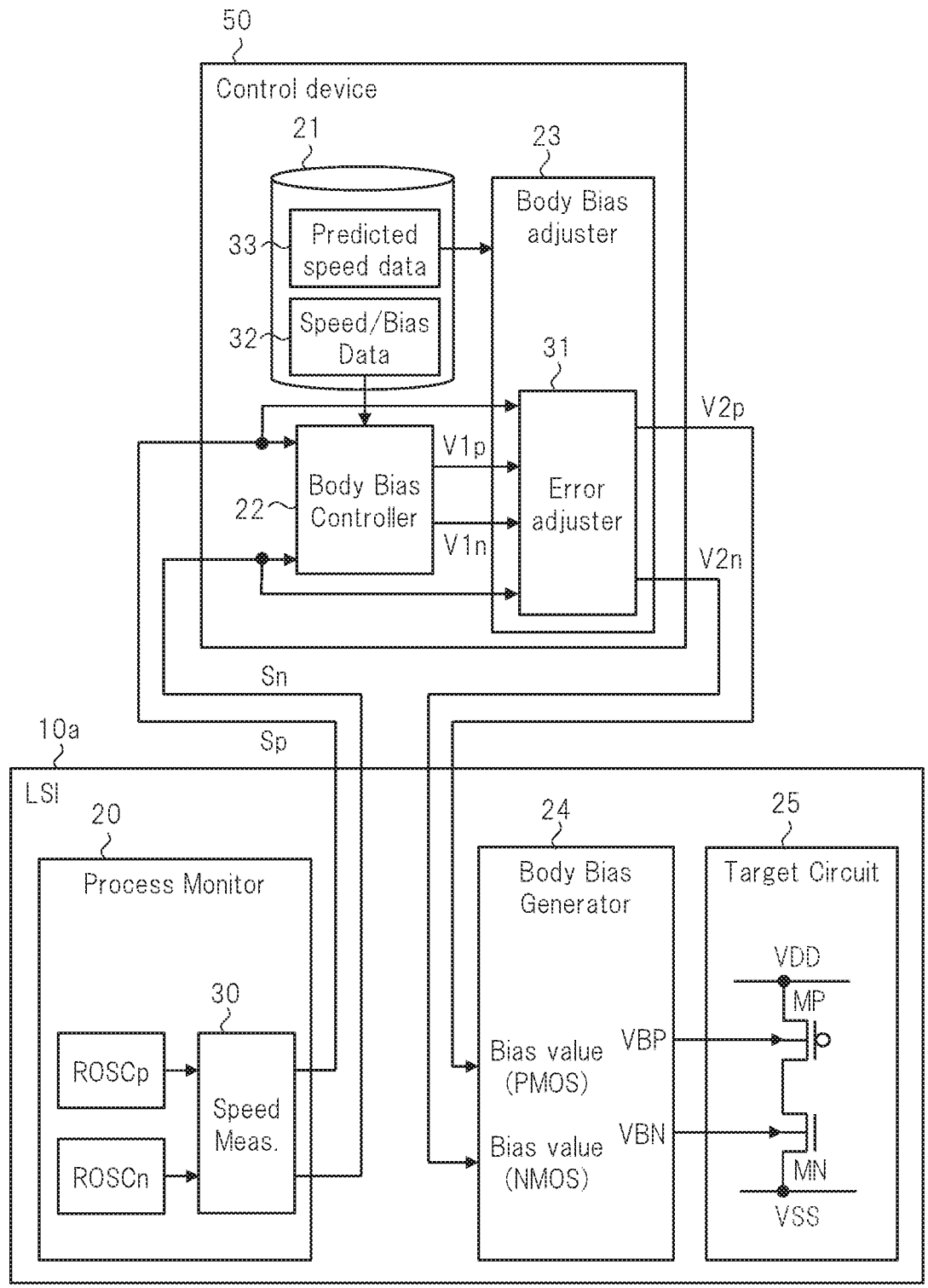
FIG. 10 is a schematic view illustrating a configuration example in which the periphery of the semiconductor device illustrated in FIG. 1 is modified.

FIG. 10 is a schematic view illustrating a configuration example in which the periphery of the semiconductor device illustrated in FIG. 1 is modified. A semiconductor device 10a illustrated in FIG. 10 includes a process monitor 20, a body bias generator 24, and a target circuit 25, which are illustrated in FIG. 1. On the other hand, a memory 21, a body bias controller 22, and a body bias adjuster 23 illustrated in FIG. 1 are mounted on a control device 50 outside the semiconductor device 10a. The control device 50 is a tester or the like, for example. The body bias controller 22 and the body bias adjuster 23 are realized by program processing using a processor included in the control device 50, for example.

The semiconductor device 10 illustrated in FIG. 1 has a configuration in which the body biases VBN and VBP can be dynamically controlled at the actual use stage. On the other hand, in a case where it is not necessary to dynamically control the body biases VBN and VBP, the configuration as illustrated in FIG. 10 may be used. Namely, the configuration of FIG. 10 is used in a case where the body biases VBN and VBP may be corrected statically in accordance with process variation in a post-manufacturing test process, for example.

By using the configuration as illustrated in FIG. 10, it becomes possible to reduce the circuit area and the like of the semiconductor device 10a as compared with the configuration of FIG. 1. Note that in FIG. 10, a speed measuring circuit 30 is mounted in the semiconductor device 10a, but may be mounted in the control device 50. The control device 50 measures operation speeds of ring oscillators ROSCn and ROSCp by setting the semiconductor device 10a to a test mode, for example. Further, the set values V2n and V2p after adjustment from the control device 50 are written to a non-volatile memory (not illustrated in FIG. 10), a fuse, or the like in the semiconductor device 10a, for example.

<Inspection Result of Semiconductor Device>

Figure 11:
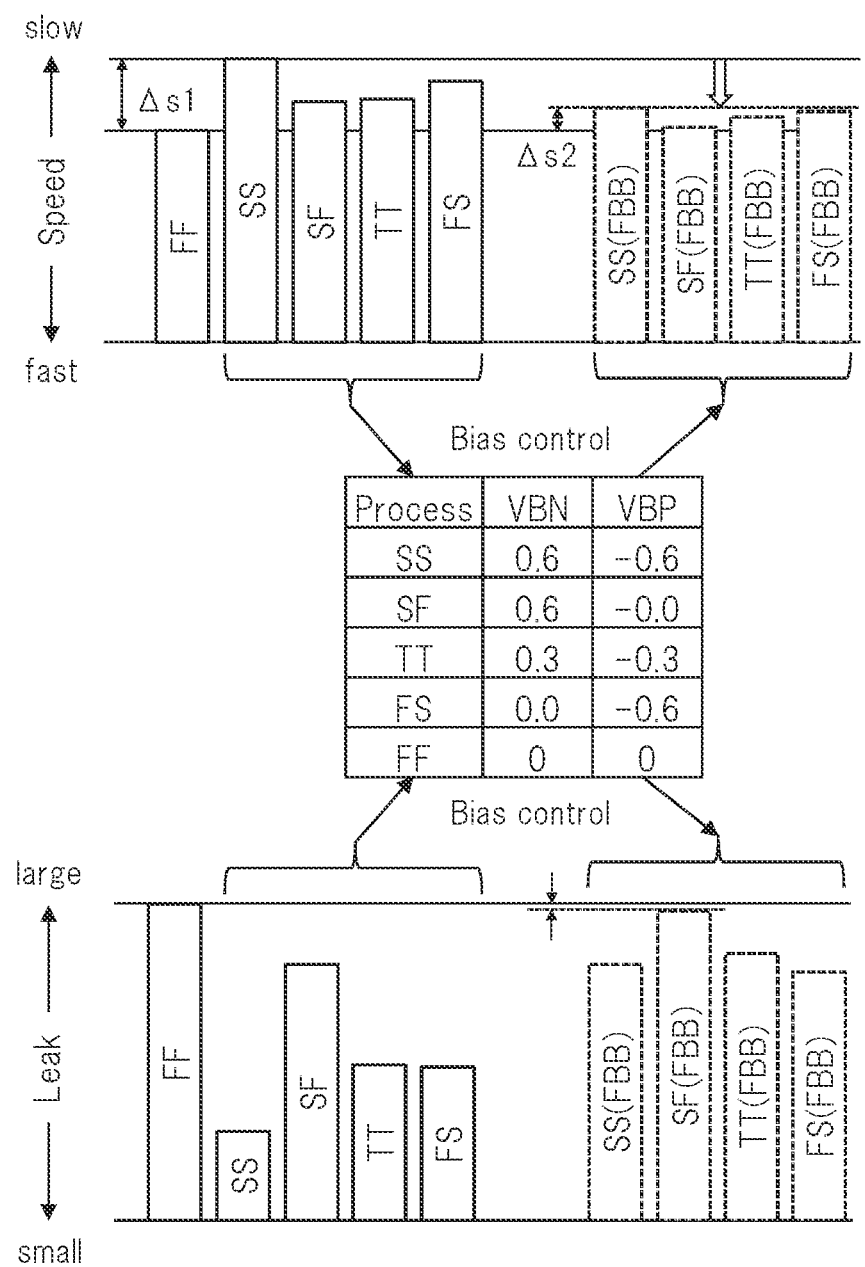
FIG. 11 is a view illustrating one example of a concrete effect in a case where the semiconductor device illustrated in FIG. 1 is used.
Figure 12:
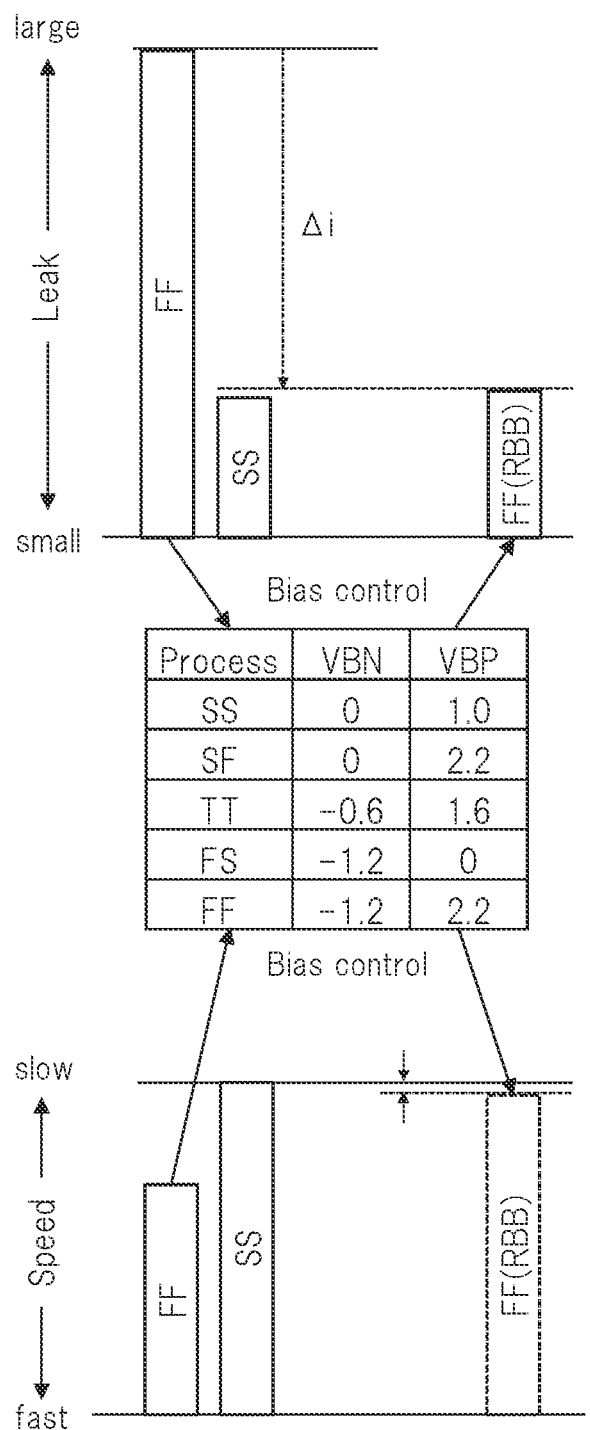
FIG. 12 is a view illustrating one example of a concrete effect in a case where the semiconductor device illustrated in FIG. 1 is used.

FIG. 11 and FIG. 12 are views illustrating one example of a concrete effect in a case where the semiconductor device illustrated in FIG. 1 is used. FIG. 11 illustrates results of inspecting a change in operation speed of the semiconductor device 10 and a change in a leakage current when the FBB control is executed on the semiconductor device 10 having the LVT type transistor illustrated in FIG. 4A. FIG. 12 illustrates results of inspecting a change in operation speed of the semiconductor device 10 and a change in a leakage current when the RBB control is executed on the semiconductor device 10 having the RVT transistor illustrated in FIG. 4B.

First, with respect to the operation speed illustrated in FIG. 11, in a case where the body biases VBN and VBP are the default values, the maximum variation Δs1 occurs between the operation speed at the time of "FF" and the operation speed at the time of "SS". On the other hand, by executing the FBB control for the body biases VBN and VBP on the basis of the speed/bias data 32 illustrated in FIG. 6, the maximum variation Δs1 can be reduced to Δs2 that is about ⅓ of the maximum variation Δs1.

Further, with respect to the leakage current illustrated in FIG. 11, in a case where the body biases VBN and VBP are the default values, the maximum leakage current is generated at the time of "FF". On the other hand, when the FBB control is executed for the body biases VBN and VBP on the basis of the speed/bias data 32 illustrated in FIG. 6, the leakage current increases at the time of "SS", "SF", "TT", and "FS". However, in any of these cases, the leakage current does not exceed the maximum leakage current generated at the time of "FF". By using the semiconductor device 10 illustrated in FIG. 1 in this manner, it becomes possible to increase the operation speed of the semiconductor device 10 whose operation speed has become slow due to the process variation while maintaining the upper limit of the leakage current.

Next, with respect to the leakage current illustrated in FIG. 12, in a case where the body biases VBN and VBP are the default values, the maximum leakage current is generated at the time of "FF", and the minimum leakage current is generated at the time of "SS". On the other hand, by executing the RBB control for the body biases VBN and VBP on the basis of the speed/bias data 32 properly set for RBB, the leakage current at the time of "FF" can be reduced to the similar level of the minimum leakage current at the time of "SS". Note that this example is configured so that the speed/bias data 32 defines the set value of the body bias VBN in the range of −0.0 V to −1.2 V, and defines the set value of the body bias VBP in the range of +1.0 V to +1.2 V.

Further, with respect to the operation speed illustrated in FIG. 12, in a case where the body biases VBN and VBP are the default values, the operation speed is the slowest at the time of "SS", and the operation speed is the fastest at the time of "FF". On the other hand, by executing the RBB control for the body biases VBN and VBP on the basis of the speed/bias data 32 for RBB, the operation speed becomes slower at the time of "FF". However, the operation speed at the time of "FF" does not become slower than the operation speed at the time of "SS". By using the semiconductor device 10 illustrated in FIG. 1 in this manner, it becomes possible to reduce the leakage current for the semiconductor device 10 whose leakage current increases due to the process variation while maintaining the lower limit of the operation speed.

<Main Effect of First Embodiment>

As described above, by using the semiconductor device according to the first embodiment, it is typically possible to properly control the body bias of the transistor even in a case where the process variation occurs. Specifically, it is possible to properly control the body bias of each of an NMOS transistor and a PMOS transistor in consideration of the balance of process variation that occurs between the NMOS transistor and the PMOS transistor. As a result, it is possible to increase the operation speed, reduce the leakage current, and eventually reduce the power consumption while properly maintaining the balance between the operation speed and the leakage current. Further, since the body bias can be controlled properly, it is possible to alleviate the demand for process variation, and facilitate timing design.

Second Embodiment

<Outline of Semiconductor Device>

Figure 13:
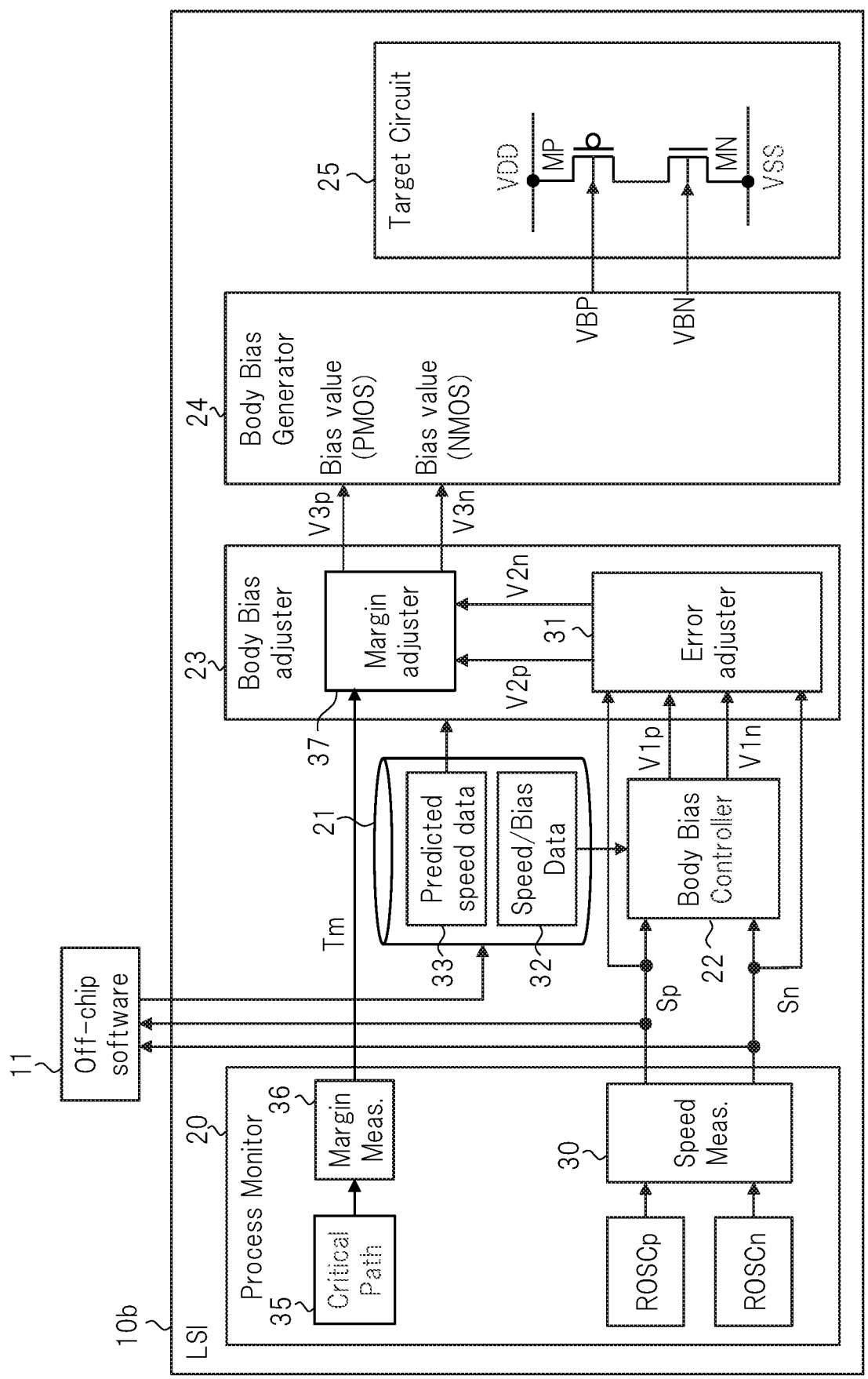
FIG. 13 is a schematic view illustrating a configuration example of a semiconductor device according to a second embodiment.

FIG. 13 is a schematic view illustrating a configuration example of a semiconductor device according to a second embodiment. In a semiconductor device 10b illustrated in FIG. 13, with respect to the configuration example of FIG. 1, a critical path monitor circuit (third process monitor circuit) 35 and a margin measuring circuit 36 are provided in a process monitor 20, and a margin adjuster 37 is provided in a body bias adjuster 23. The critical path monitor circuit 35 includes a circuit configuration to which critical paths in a target circuit 25 are reflected. The critical paths in the target circuit 25 are known in advance by timing simulation of the target circuit 25 or the like.

The margin measuring circuit 36 measures a timing margin Tm of the critical path monitor circuit 35. The margin adjuster 37 symmetrically readjusts set values V2n and V2p after adjustment by an error adjuster 31 so that the timing margin Tm measured by the margin measuring circuit 36 approaches the minimum value defined in advance. Then, the margin adjuster 37 outputs set values V3n and V3p after readjustment to a body bias generator 24. The body bias generator 24 generates body biases VBN and VBP on the basis of the set values V3n and V3p after readjustment, and applies them to the target circuit 25 and the like.

<Details Around Margin Adjuster>

Figure 14:
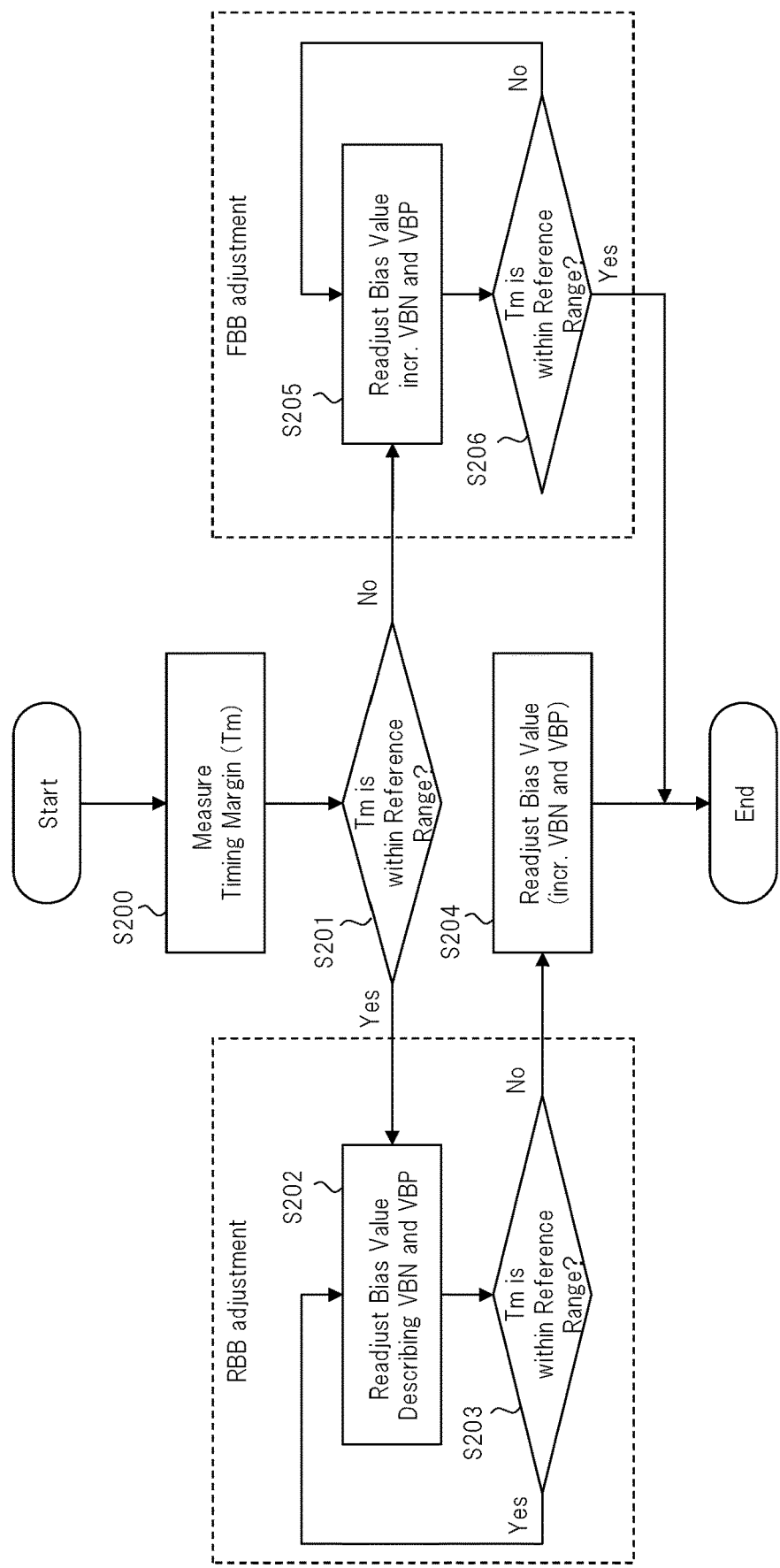
FIG. 14 is a flow diagram illustrating one example of the processing content around a margin adjuster illustrated in FIG. 13.
Figure 15:
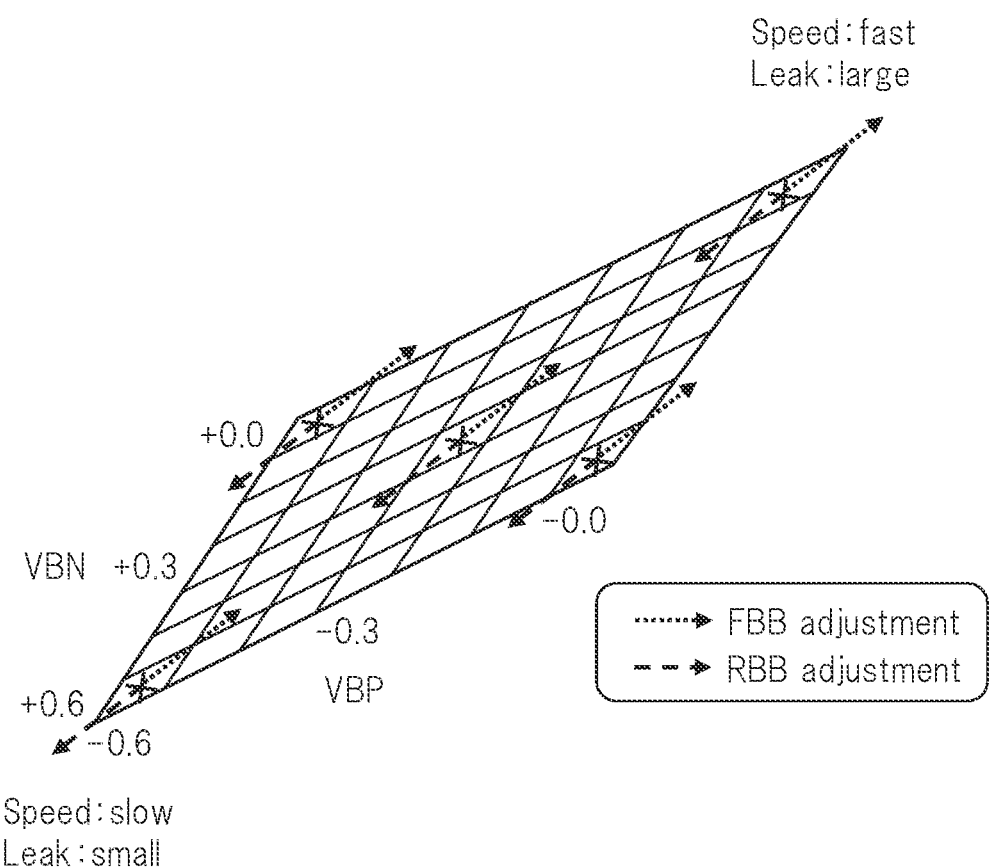
FIG. 15 is a schematic view illustrating a concrete method of margin adjustment in FIG. 14.

FIG. 14 is a flow diagram illustrating one example of the processing content around the margin adjuster illustrated in FIG. 13. FIG. 15 is a schematic view illustrating a concrete method of margin adjustment in FIG. 14. In FIG. 14, the margin measuring circuit 36 first measures the timing margin Tm of the critical path monitor circuit 35 (Step S200). At this time, the body biases VBN and VBP based on the set values V2n and V2p after adjustment are applied to the critical path monitor circuit 35, for example. Subsequently, the margin adjuster 37 determines whether the timing margin Tm is within a reference range defined by the timing simulation or the like or not (Step S201).

In a case where it is determined at Step S201 that the timing margin Tm is within the reference range, the margin adjuster 37 symmetrically readjusts the set values V2n and V2p after adjustment by the error adjuster 31 toward an RBB direction (Step S202). Specifically, as illustrated in FIG. 15, the margin adjuster 37 symmetrically readjusts the body biases VBN and VBP so that the absolute values of adjustment amounts for the two body biases VBN and VBP becomes equal to each other in the direction of reducing a leakage current of the target circuit 25.

Then, the margin adjuster 37 repeatedly executes the process at Step S202 while changing the adjustment amount for each unit step so long as the timing margin Tm is within the reference range (Step S203). When the timing margin Tm becomes outside the reference range at Step S203, the error adjuster 31 returns a current adjustment amount in an FBB direction by one unit step (Step S204).

The case where the timing margin Tm is within the reference range means a case where operation speed satisfies a desired condition and there is still room for reducing a leakage current in accordance with an amount of the timing margin Tm. Therefore, by using the processes at Steps S202 to S204, the set values V3n and V3p after readjustment are determined so that the timing margin Tm becomes the minimum value and the leakage current becomes the minimum value. Since the body biases VBN and VBP are symmetrically readjusted at this time, the balance between the two body biases VBN and VBP according to the process variation, which has been described in the first embodiment, is maintained as it is.

On the other hand, in a case where it is determined at Step S201 that the timing margin Tm is out of the reference range, the margin adjuster 37 symmetrically readjusts the set values V2n and V2p after adjustment by the error adjuster 31 in the FBB direction (Step S205). Specifically, as illustrated in FIG. 15, the margin adjuster 37 symmetrically readjusts the body biases VBN and VBP so that the absolute values of the adjustment amounts for the two body biases VBN and VBP becomes equal to each other in the direction of increasing the operation speed of the target circuit 25. The margin adjuster 37 repeatedly executes the process at Step S205 while changing the adjustment amount for each unit step so that the timing margin Tm is within the reference range (Step S206).

The case where the timing margin Tm is out of the reference range means that the timing margin Tm is smaller than the required minimum value as a result of the operation speed being too slow. Therefore, when the processes at Steps S205 and S206 are used, the set values V3n and V3p after readjustment are determined so that the timing margin Tm becomes the minimum value. At the minimum value of the timing margin Tm, the leakage current becomes the minimum. Further, since the body biases VBN and VBP are symmetrically readjusted at Steps S205 and S206, the balance between the two body biases VBN and VBP according to the process variation, which has been described in the first embodiment, is maintained as it is.

<Main Effect of Second Embodiment>

As described above, by using the semiconductor device according to the second embodiment, it becomes possible to determine the body biases VBN and VBP so that the leakage current is minimized within the range where the condition of the timing margin is satisfied. As a result, it becomes possible to further reduce the leakage current and eventually the power consumption in addition to the various effects described in the first embodiment.

As described above, the invention made by inventors of the present application has been described specifically on the basis of the embodiments. However, the present invention is not limited to the embodiments described above, and it goes without saying that the present invention may be modified into various forms without departing from the substance thereof. For example, the embodiments described above have been explained in detail for explaining the present invention clearly. The present invention is not necessarily limited to one that includes all configurations that have been explained. Further, a part of the configuration of one embodiment can be replaced by a configuration of the other embodiment. Further, a configuration of the other embodiment can be added to a configuration of one embodiment. Further, a part of the configuration of each of the embodiments can be added to the other configuration, deleted, or replaced thereby.

What is claimed is:

1. A semiconductor device comprising:
   a target circuit configured to execute a desired logic operation, the target circuit including a first conductivity-type transistor to which a first body bias is applied and a second conductivity-type transistor to which a second body bias is applied;
   a first process monitor circuit including a first conductivity-type transistor and a second conductivity-type transistor each having a same device structure as that in the target circuit, operation speed of the first process monitor circuit changing due to an influence of process variation of the first conductivity-type transistor rather than the second conductivity-type transistor;
   a second process monitor circuit including a first conductivity-type transistor and a second conductivity-type transistor each having a same device structure as that in the target circuit, operation speed of the second process monitor circuit changing due to an influence of process variation of the second conductivity-type transistor rather than the first conductivity-type transistor;
   a speed measuring circuit configured to measure the operation speed of the first process monitor circuit as a first speed value, and measure the operation speed of the second process monitor circuit as a second speed value;
   a memory configured to hold speed/bias data representing a correspondence relationship between the operation speed of the first process monitor circuit and the operation speed of the second process monitor circuit, and a first set value of the first body bias and a second set value of the second body bias; and
   a body bias controller configured to receive the first speed value and the second speed value measured by the speed measuring circuit of the first process monitor circuit and the second process monitor circuit to which the first body bias and the second body bias based on default values are respectively applied, and obtain the first set value and the second set value on a basis of the speed/bias data.

2. The semiconductor device according to claim 1, wherein the speed/bias data are configured by defining a variation region within a two-dimensional speed space in which the operation speed of the first conductivity-type transistor and the operation speed of the second conductivity-type transistor are variables, dividing the variation region into a plurality of division regions, and determining the first set value and the second set value for each of the plurality of division regions, the variation region being caused by process variation of the first conductivity-type transistor and the second conductivity-type transistor.

3. The semiconductor device according to claim 2, wherein each of the first conductivity-type transistor and the second conductivity-type transistor is formed of a low threshold voltage type SOI (Silicon on Insulator) structure,
wherein the plurality of division regions includes:
an FF region in which both of the operation speed of the first conductivity-type transistor and the operation speed of the second conductivity-type transistor are fastest;
an SS region in which both of the operation speed of the first conductivity-type transistor and the operation speed of the second conductivity-type transistor are slowest;
an FS region in which the operation speed of the first conductivity-type transistor is fastest and the operation speed of the second conductivity-type transistor is slowest; and
an SF region in which the operation speed of the first conductivity-type transistor is slowest and the operation speed of the second conductivity-type transistor is fastest, and
wherein the first set value and the second set value are set so that absolute values thereof are equal in the FF region and the SS region; are set so that the first set value becomes 0 V in the FS region; and are set so that the second set value becomes 0 V in the SF region.

4. The semiconductor device according to claim 2, wherein the memory is further configured to hold predicted speed data representing a predicted area of the operation speeds of the first process monitor circuit and the second process monitor circuit, the predicted area being predicted in a case where the first body bias and the second body bias based on a plurality of the first set values and a plurality of the second set values contained in the speed/bias data are respectively applied,
wherein the speed measuring circuit is further configured to measure the first speed value and the second speed value of the first process monitor circuit and the second process monitor circuit to which the first body bias based on the first set value and the second body bias based on the second set value from the body bias controller are respectively applied,
wherein the semiconductor device further comprises:
an error adjuster configured to receive the first speed value and the second speed value measured by the speed measuring circuit, and adjust one or both of the first set value and the second set value obtained by the body bias controller in a case where the first speed value and the second speed value are not included in the predicted area represented by the predicted speed data.

5. The semiconductor device according to claim 4, wherein the error adjuster is further configured to adjust one or both of the first set value and the second set value by a difference amount defined in advance in the two-dimensional speed space in which the operation speed of the first conductivity-type transistor and the operation speed of the second conductivity-type transistor are variables on a basis of a positional relationship between the predicted area represented by the predicted speed data and a plot point represented by the first speed value and the second speed value.

6. The semiconductor device according to claim 1, wherein the first process monitor circuit is a ring oscillator composed of a plurality of stages of NAND gates, and
wherein the second process monitor circuit is a ring oscillator composed of a plurality of stages of NOR gates.

7. The semiconductor device according to claim 4, further comprising:
a third process monitor circuit including a circuit configuration to which a critical path in the target circuit is reflected;
a margin measuring circuit configured to measure a timing margin of the third process monitor circuit; and
a margin adjuster configured to symmetrically readjust the first set value after adjustment and the second set value after adjustment by the error adjuster so that the timing margin approaches a minimum value defined in advance.

8. A method for controlling body bias of a semiconductor device,
wherein the semiconductor device comprises:
a target circuit configured to execute a desired logic operation, the target circuit including a first conductivity-type transistor to which a first body bias is applied and a second conductivity-type transistor to which a second body bias is applied;
a first process monitor circuit including a first conductivity-type transistor and a second conductivity-type transistor each having a same device structure as that in the target circuit, operation speed of the first process monitor circuit changing due to an influence of process variation of the first conductivity-type transistor rather than the second conductivity-type transistor; and
a second process monitor circuit including a first conductivity-type transistor and a second conductivity-type transistor each having a same device structure as that in the target circuit, operation speed of the second process monitor circuit changing due to an influence of process variation of the second conductivity-type transistor rather than the first conductivity-type transistor,
the method comprising:
holding speed/bias data in a memory, the speed/bias data representing a correspondence relationship between the operation speed of the first process monitor circuit and the operation speed of the second process monitor circuit, and a first set value of the first body bias and a second set value of the second body bias;
measuring the operation speed of the first process monitor circuit as a first speed value;
measuring the operation speed of the second process monitor circuit as a second speed value;
receiving the first speed value and the second speed value thus measured of the first process monitor circuit and the second process monitor circuit to which the first body bias and the second body bias based on default values are respectively applied; and
obtaining the first set value and the second set value on a basis of the speed/bias data.

9. The method for controlling body bias of a semiconductor device according to claim 8,
wherein the speed/bias data are configured by defining a variation region within a two-dimensional speed space in which the operation speed of the first conductivity-type transistor and the operation speed of the second conductivity-type transistor are variables, dividing the variation region into a plurality of division regions, and determining the first set value and the second set value for each of the plurality of division regions, the variation region being caused by process variation of the first conductivity-type transistor and the second conductivity-type transistor.

10. The method for controlling body bias of a semiconductor device according to claim 9,
wherein each of the first conductivity-type transistor and the second conductivity-type transistor is formed of a low threshold voltage type SOI (Silicon on Insulator) structure,
wherein the plurality of division regions includes:
an FF region in which both of the operation speed of the first conductivity-type transistor and the operation speed of the second conductivity-type transistor are fastest;
an SS region in which both of the operation speed of the first conductivity-type transistor and the operation speed of the second conductivity-type transistor are slowest;
an FS region in which the operation speed of the first conductivity-type transistor is fastest and the operation speed of the second conductivity-type transistor is slowest; and
an SF region in which the operation speed of the first conductivity-type transistor is slowest and the operation speed of the second conductivity-type transistor is fastest, and
wherein the first set value and the second set value are set so that absolute values thereof are equal in the FF region and the SS region; are set so that the first set value becomes 0 V in the FS region; and are set so that the second set value becomes 0 V in the SF region.

11. The method for controlling body bias of a semiconductor device according to claim 8, the method further comprising:
holding predicted speed data in the memory, the predicted speed data representing a predicted area of the operation speeds of the first process monitor circuit and the second process monitor circuit, the predicted area being predicted in a case where the first body bias and the second body bias based on a plurality of the first set values and a plurality of the second set values contained in the speed/bias data are respectively applied;
measuring the first speed value and the second speed value of the first process monitor circuit and the second process monitor circuit to which the first body bias based on the first set value and the second body bias based on the second set value are respectively applied; and
adjusting one or both of the first set value and the second set value in a case where the first speed value and the second speed value are not included in the predicted area represented by the predicted speed data.

12. The method for controlling body bias of a semiconductor device according to claim 11, the method further comprising:
when the first set value and the second set value are adjusted, adjusting one or both of the first set value and the second set value by a difference amount defined in advance in the two-dimensional speed space in which the operation speed of the first conductivity-type transistor and the operation speed of the second conductivity-type transistor are variables on a basis of a positional relationship between the predicted area represented by the predicted speed data and a plot point represented by the first speed value and the second speed value.

* * * * *